(12) United States Patent
Takenaka

(10) Patent No.: US 12,277,994 B2
(45) Date of Patent: Apr. 15, 2025

(54) NON-VOLATILE MEMORY

(71) Applicant: Rohm Co., Ltd., Kyoto (JP)

(72) Inventor: Seiji Takenaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 135 days.

(21) Appl. No.: 18/247,114

(22) PCT Filed: Sep. 2, 2021

(86) PCT No.: PCT/JP2021/032221
§ 371 (c)(1),
(2) Date: Mar. 29, 2023

(87) PCT Pub. No.: WO2022/074967
PCT Pub. Date: Apr. 14, 2022

(65) Prior Publication Data
US 2023/0377617 A1   Nov. 23, 2023

(30) Foreign Application Priority Data
Oct. 5, 2020   (JP) .................................. 2020-168240

(51) Int. Cl.
*G11C 7/00* (2006.01)
*G11C 7/08* (2006.01)
*G11C 7/10* (2006.01)

(52) U.S. Cl.
CPC .............. *G11C 7/1096* (2013.01); *G11C 7/08* (2013.01); *G11C 7/1069* (2013.01)

(58) Field of Classification Search
CPC ......... G11C 16/08; G11C 16/24; G11C 16/26; G11C 16/10; G11C 11/5642; G11C 16/0483; G11C 16/32; G11C 11/5628; G11C 16/0408; G11C 16/18; G11C 16/30; G11C 17/12; G11C 2211/5621; G11C 7/08; G11C 7/1069; G11C 7/1096; G11C 8/00; G11C 11/4094; G11C 11/4097; G11C 11/419; G11C 11/40; G11C 11/403; G11C 11/404; G11C 11/408; G11C 11/409; G11C 11/4091; G11C 11/412; G11C 16/04; G11C 16/0466; G11C 16/3418; G11C 16/3427; G11C 5/02; G11C 5/025; G11C 5/063;
(Continued)

(56) References Cited

U.S. PATENT DOCUMENTS 9,058,888 B2 * 6/2015 Milani ................. G11C 17/146

FOREIGN PATENT DOCUMENTS

JP   2011103158   5/2011

OTHER PUBLICATIONS

International Search Report for PCT/JP2021/032221 dated Oct. 19, 2021 with English translation (4 pages).

* cited by examiner

*Primary Examiner* — Thong Q Le
(74) *Attorney, Agent, or Firm* — Fish & Richardson P.C.

(57) ABSTRACT

A non-volatile memory includes a memory cell having a first transistor and a second transistor, a driving circuit arranged to apply a read voltage to gates of the first and second transistors, and a signal output circuit arranged to output a signal associated with a first value or a signal associated with a second value, based on drain currents of the first and second transistors, in a read operation in which the read voltage is applied. The second transistor is constituted of a parallel circuit of a plurality of unit transistors, and gate width of each of the unit transistors is larger than that of the first transistor.

7 Claims, 20 Drawing Sheets

(58) Field of Classification Search
CPC .... G11C 7/18; G11C 8/08; G11C 8/10; G11C 8/14; G11C 8/16
See application file for complete search history.

READ PERIOD

CASE OF $I_{D2} > I_{D1}$ (BEFORE PROGRAM OPERATION)

READ OPERATION BEFORE PROGRAM OPERATION

[SECOND METHOD]

READ OPERATION (BEFORE PROGRAM OPERATION)

of the carrier injection must be much smaller than 1. Satisfying these requirements is not always easy. It is desired to develop a configuration that satisfies these requirements and can stably write and read desired values.

It is an object of the present disclosure to provide a non-volatile memory that can contribute to stable write and read of desired values.

Means for Solving the Problem

A non-volatile memory according to the present disclosure includes a memory cell having a first transistor and a second transistor, a driving circuit configured to apply a read voltage to gates of the first and second transistors, and a signal output circuit configured to output a signal associated with a first value or a signal associated with a second value, on the basis of drain currents of the first and second transistors, in a read operation in which the read voltage is applied. The second transistor is constituted of a parallel circuit of a plurality of unit transistors, and gate width of each of the unit transistors is larger than that of the first transistor.

Advantageous Effects of the Disclosure

According to the present disclosure, it is possible to provide a non-volatile memory that can contribute to stable write and read of desired values.

NON-VOLATILE MEMORY

CROSS REFERENCE OF RELATED APPLICATIONS

This application is a U.S. National Phase application under 35 U.S.C. § 371 of International Patent Application No. PCT/JP2021/032221, filed on Sep. 2, 2021, which claims the priority of Japanese Patent Application No. 2020-168240, filed on Oct. 5, 2020, the disclosure of which is incorporated herein by reference in its entirety.

TECHNICAL FIELD

The present disclosure relates to a non-volatile memory.

BACKGROUND ART

There is a non-volatile memory that utilizes hot carrier injection into a transistor. This type of non-volatile memory includes first and second transistors as memory elements whose characteristics are the same in the initial state, and hot carriers are injected into only one of the transistors to change the characteristics. In read operation after that, on the basis of large/small relationship between drain currents when the same gate voltage is applied to the first and second transistors, stored data "0" or "1" is read out. For instance, a state where the drain current of the first transistor is smaller (a state where characteristics of the first transistor are changed) corresponds to a state where data "0" is stored, while a state where the drain current of the second transistor is smaller (a state where characteristics of the second transistor are changed) corresponds to a state where data "1" is stored.

However, in the non-volatile memory described above, stored data (stored value) in the initial state is unstable. In this case, a process for responding to the unstableness of stored data should be performed with other peripheral circuit, which may be inconvenient in the light of the circuit scale or the like. There is proposed a non-volatile memory configured so that more drain current flows in the second transistor out of the first and second transistors in the initial state, in order to prevent unstableness of stored data in the initial state. In this type of non-volatile memory, stored data can be defined to be "0" in the initial state, and stored data "1" can be realized after hot carrier injection into the second transistor.

LIST OF CITATIONS

Patent Literature

Patent Document 1: JP-A-2011-103158

SUMMARY OF THE DISCLOSURE

Technical Problem

Figure 12:
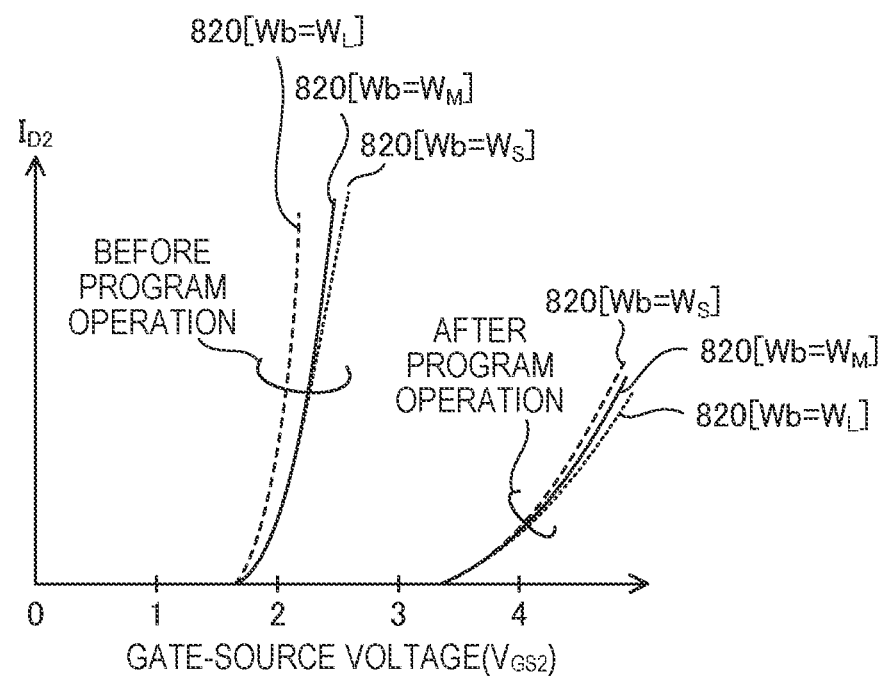

In this case, it is required to stably read data "0" from the non-volatile memory in the initial state, and to stably read data "1" from the non-volatile memory after the hot carrier injection. A drain current ratio between the second transistor and the first transistor in the read operation to read data from the non-volatile memory is denoted by N. In order to satisfy the above requirement while considering influences of temperature fluctuation, manufacturing error, and the like, the drain current ratio N in the initial state must be much larger than 1 (e.g., N=4), and the drain current ratio N after the hot FIG. 12 is a diagram illustrating characteristics of the transistor corresponding to the configuration of FIG. 10 (second method).

Figure 10:
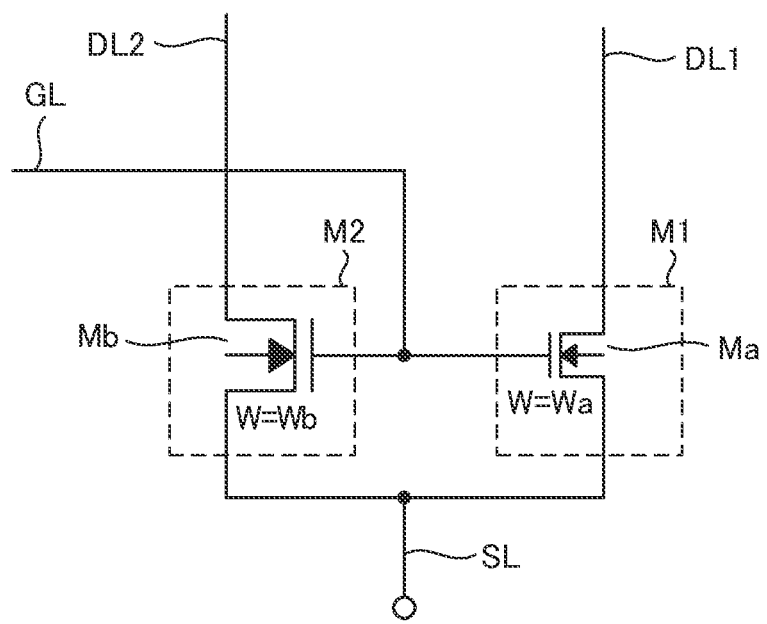
FIG. 10 is a diagram illustrating another configuration method (second method) of two transistors in the storage circuit, according to the first embodiment of the present disclosure.
Figure 13:
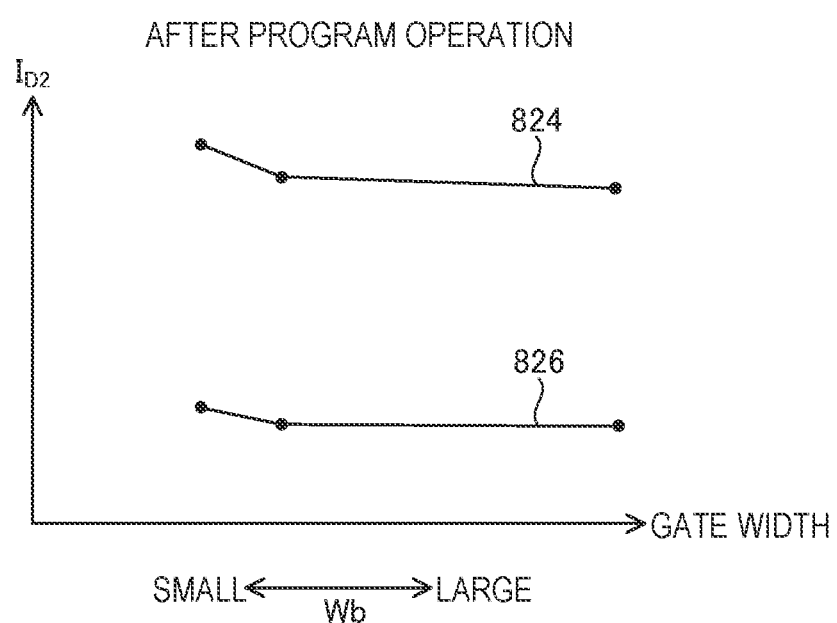

FIG. 13 is a diagram illustrating characteristics of the transistor corresponding to the configuration of FIG. 10 (second method).

Figure 14A:
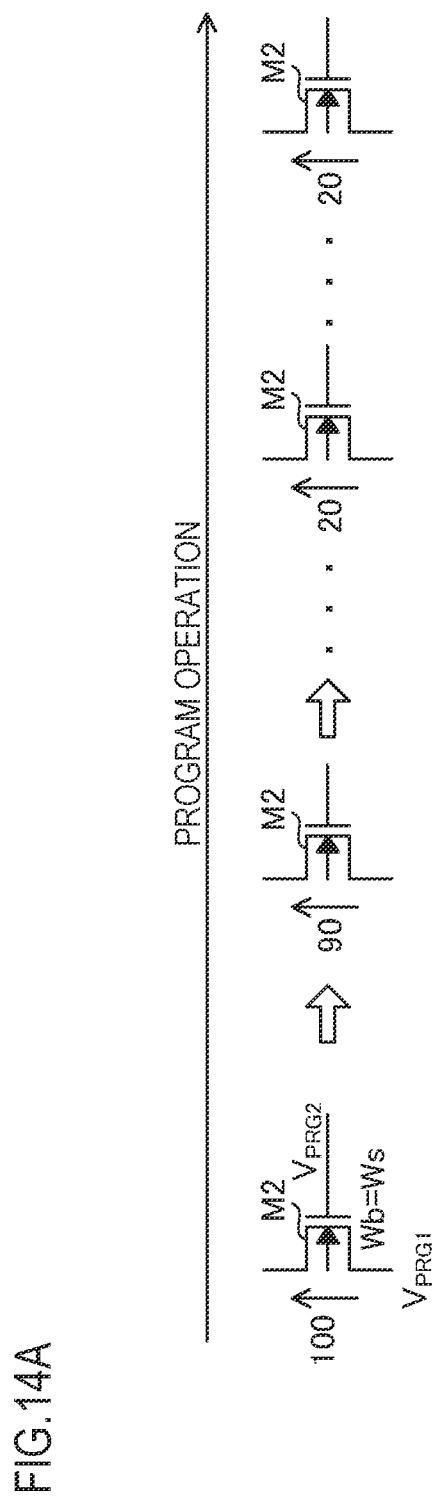

FIG. 14A is a diagram illustrating influence of hot carrier injection, according to the first embodiment of the present disclosure.

Figure 14B:
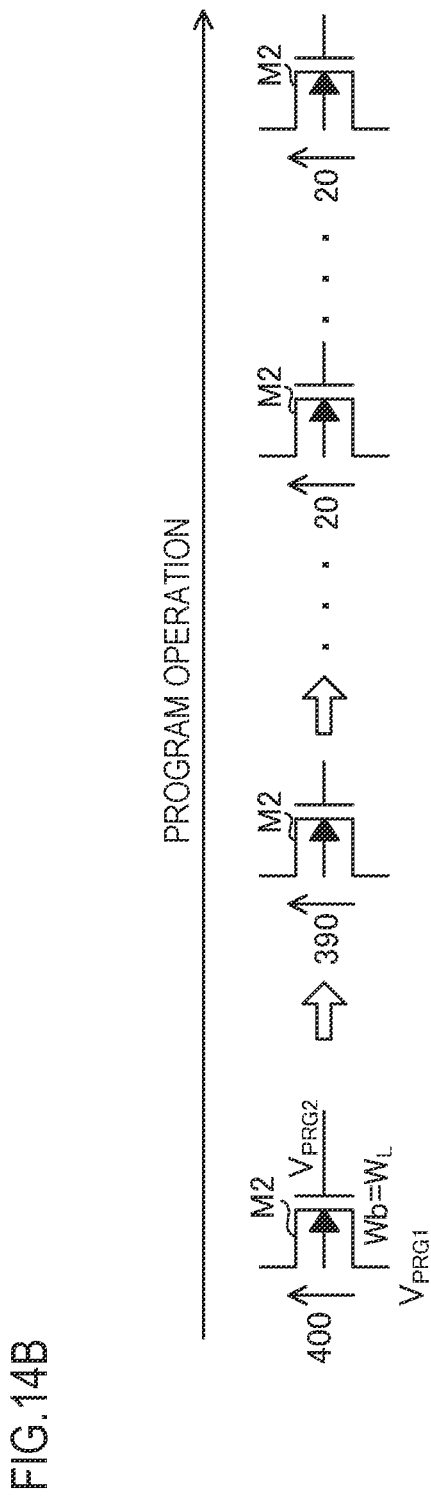

FIG. 14B is a diagram illustrating influence of hot carrier injection, according to the first embodiment of the present disclosure.

Figure 7:
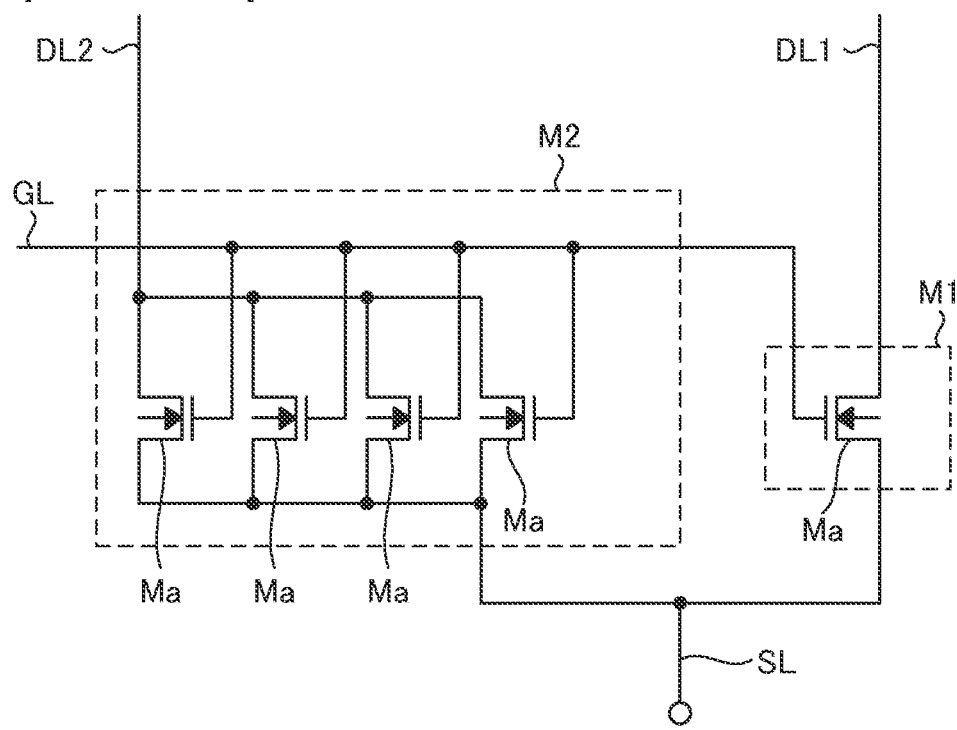
FIG. 7 is a diagram illustrating a configuration method (first method) of two transistors in the storage circuit, according to the first embodiment of the present disclosure.
Figure 15A:
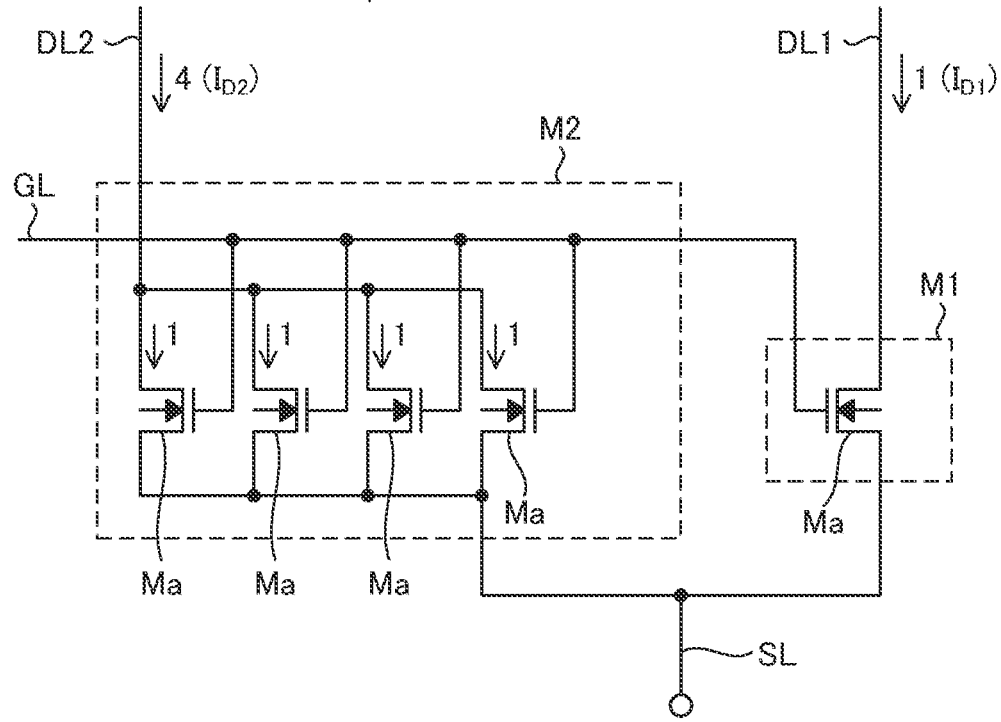

FIG. 15A is a diagram illustrating drain current in the read operation when adopting the configuration of FIG. 7 (first method), according to the first embodiment of the present disclosure.

Figure 15B:
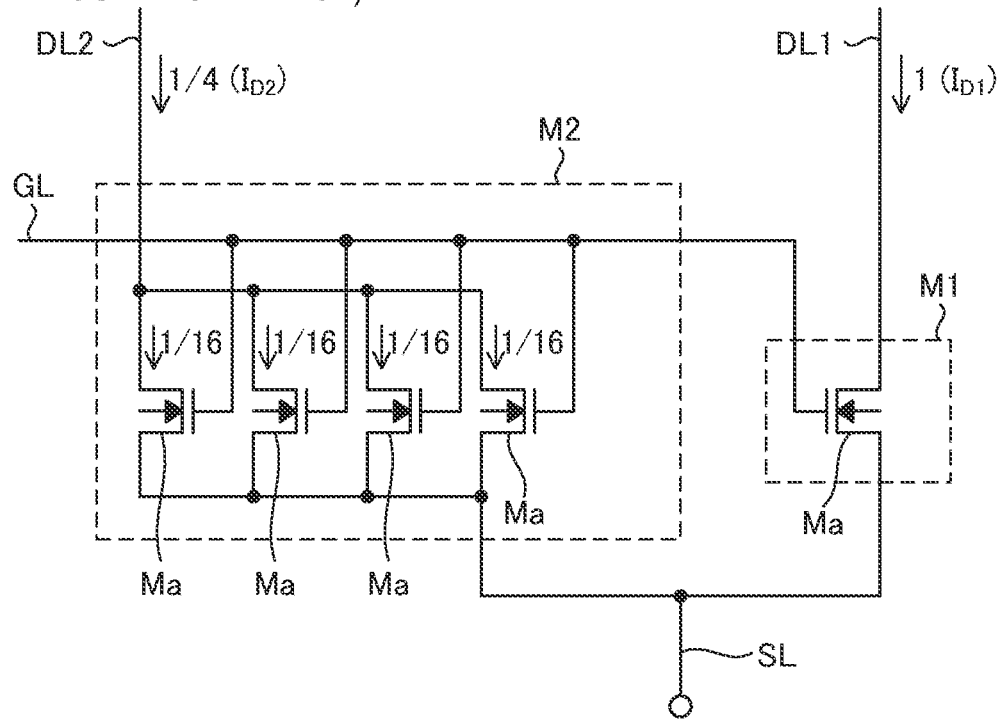

FIG. 15B is a diagram illustrating drain current in the read operation when adopting the configuration of FIG. 7 (first method), according to the first embodiment of the present disclosure.

Figure 16:
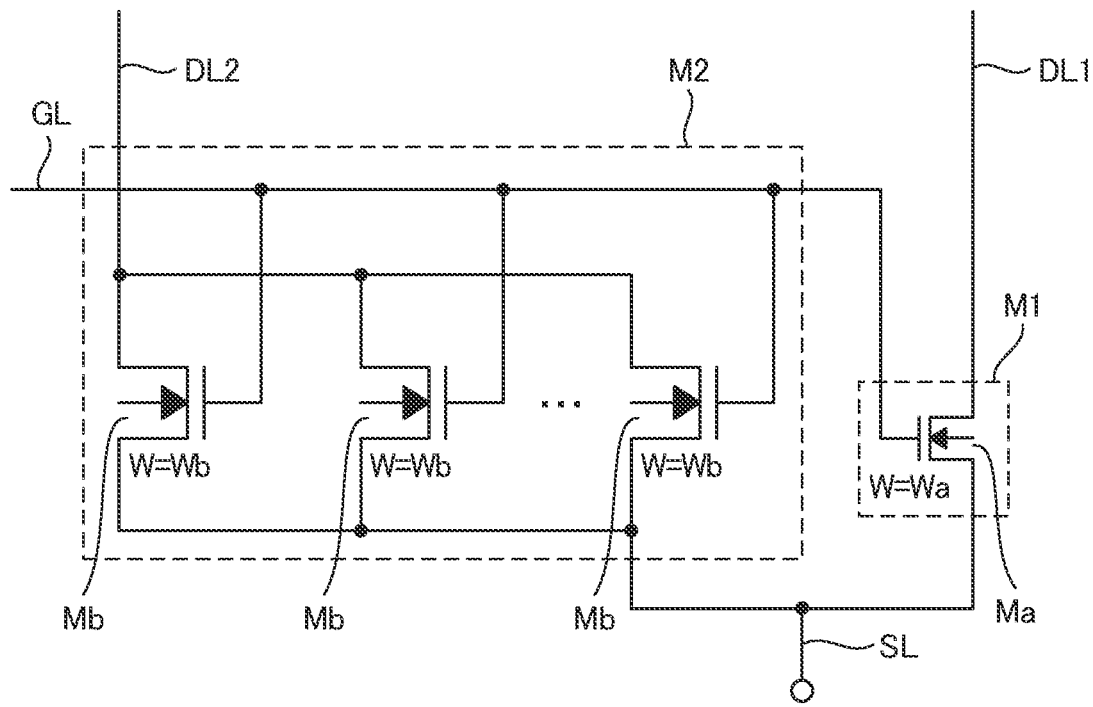

FIG. 16 is a diagram illustrating still another configuration method (third method) of two transistors in the storage circuit, according to the first embodiment of the present disclosure.

Figure 17A:
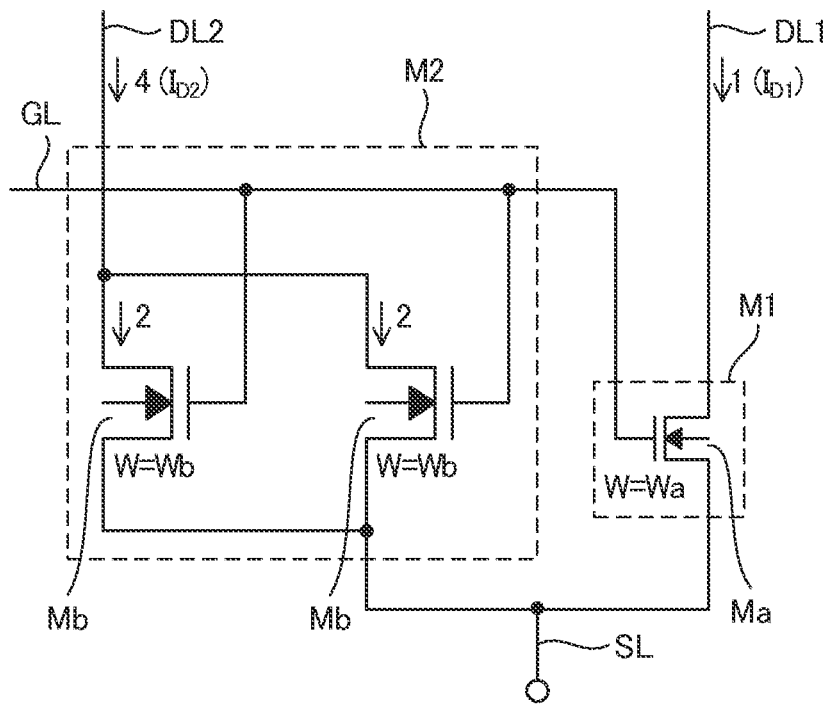

FIG. 17A is a diagram illustrating drain current in the read operation when adopting the configuration of FIG. 16 (third method), according to the first embodiment of the present disclosure.

Figure 17B:
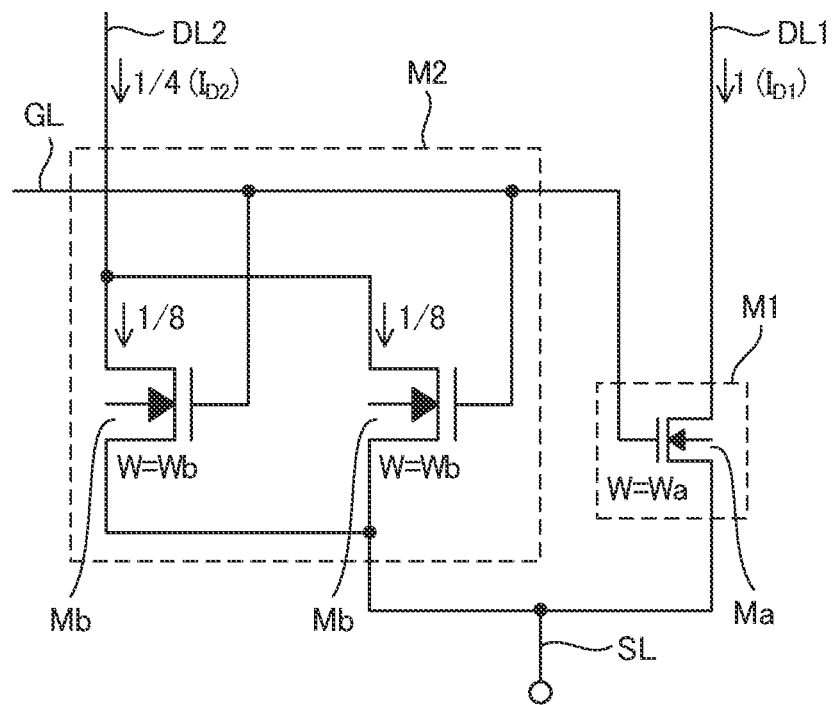

FIG. 17B is a diagram illustrating drain current in the read operation when adopting the configuration of FIG. 16 (third method), according to the first embodiment of the present disclosure.

Figure 18:
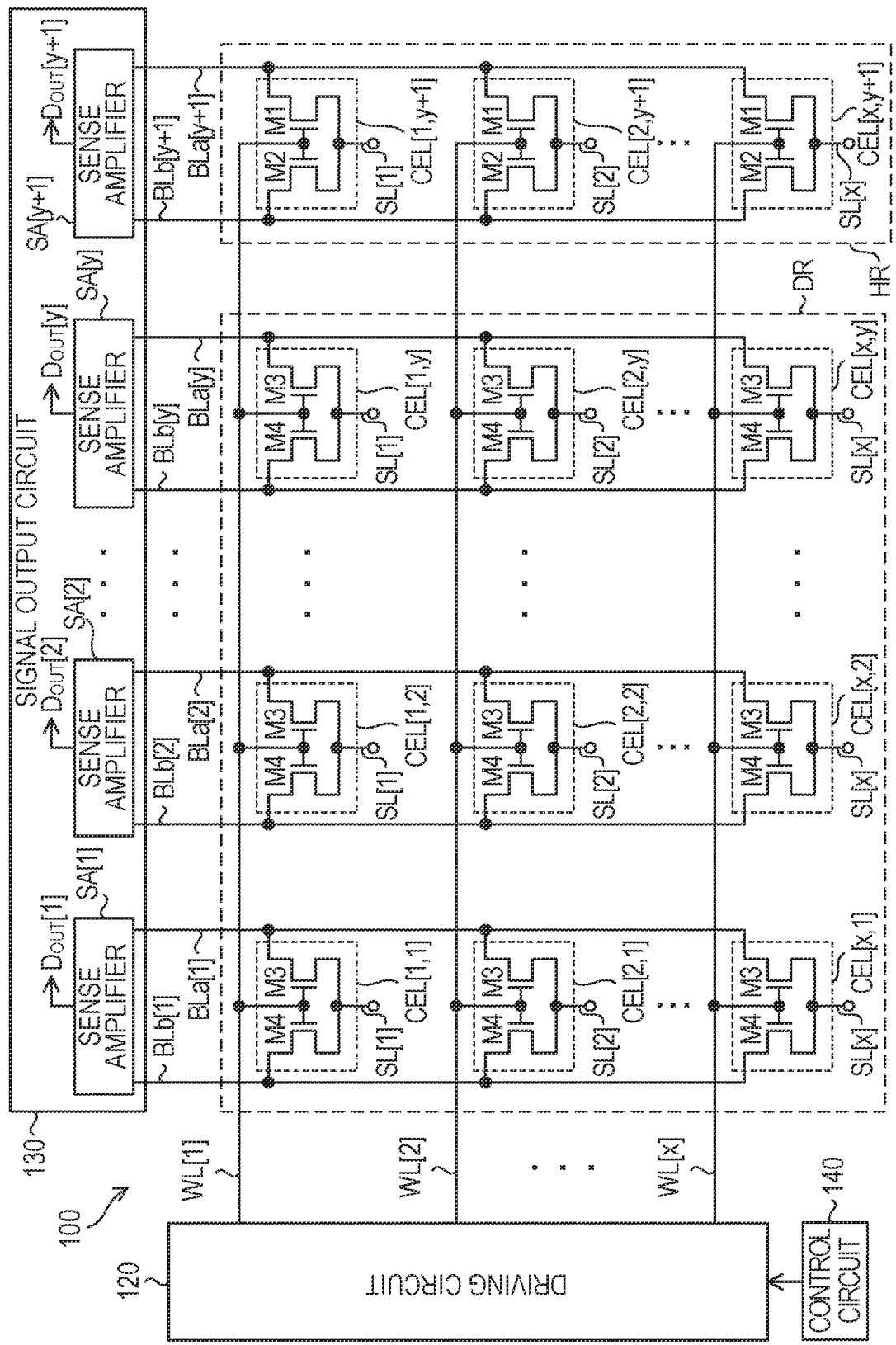

FIG. 18 is a configuration diagram of a memory array, according to a second embodiment of the present disclosure.

Figure 19:
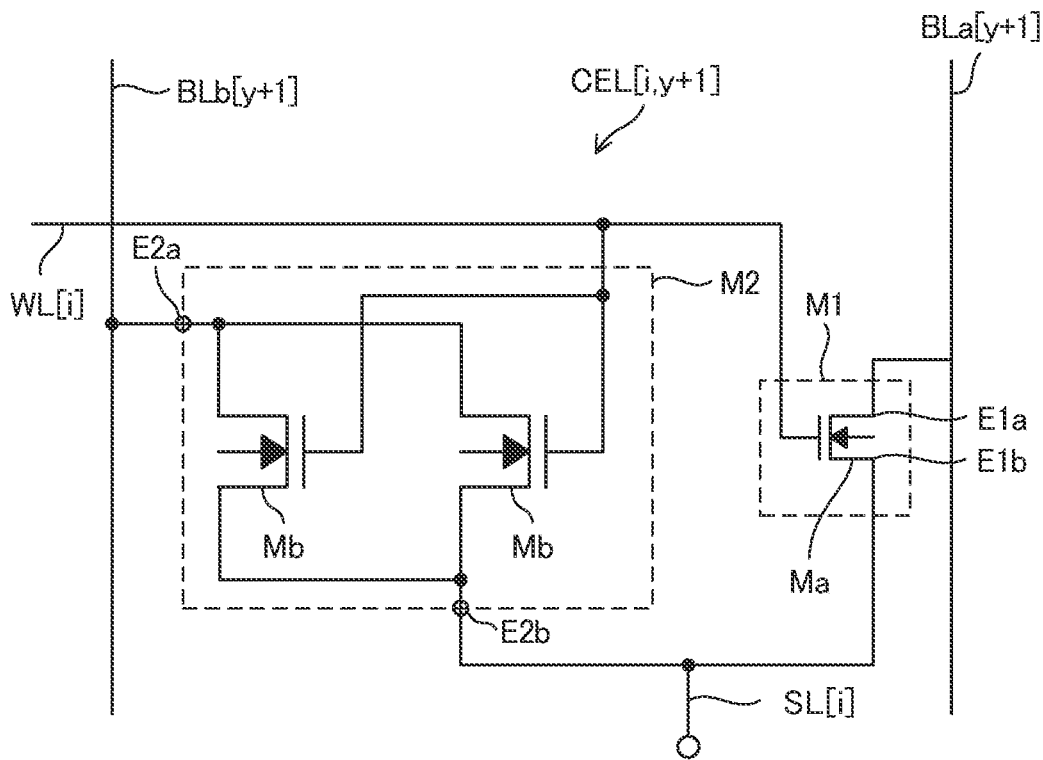

FIG. 19 is a configuration diagram of one history memory cell included in the memory array, according to the second embodiment of the present disclosure.

Figure 20:
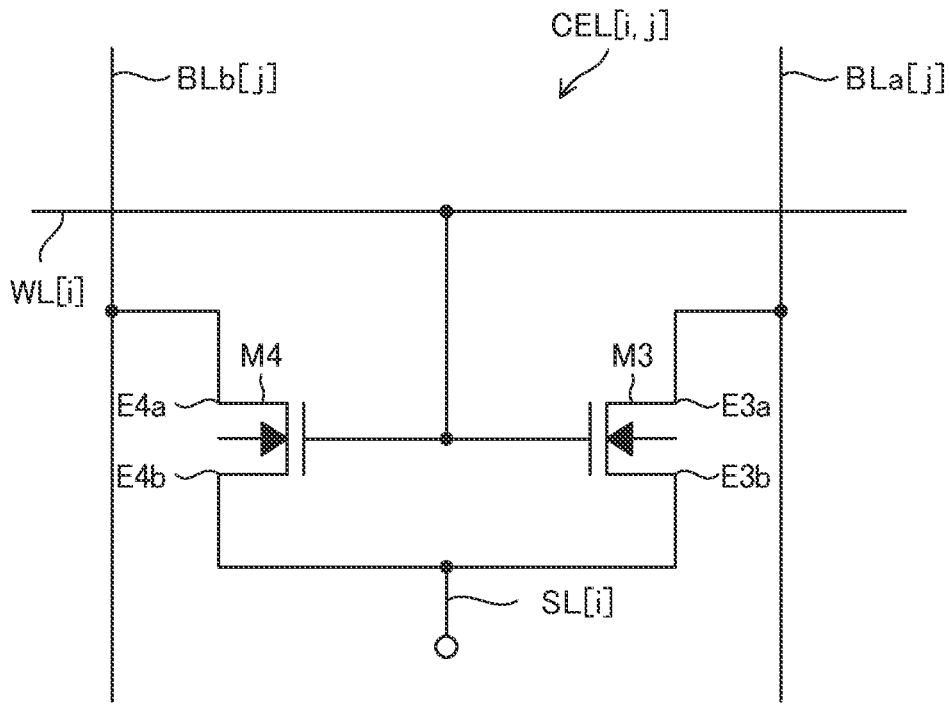

FIG. 20 is a configuration diagram of one data memory cell included in the memory array, according to the second embodiment of the present disclosure.

Figure 21:
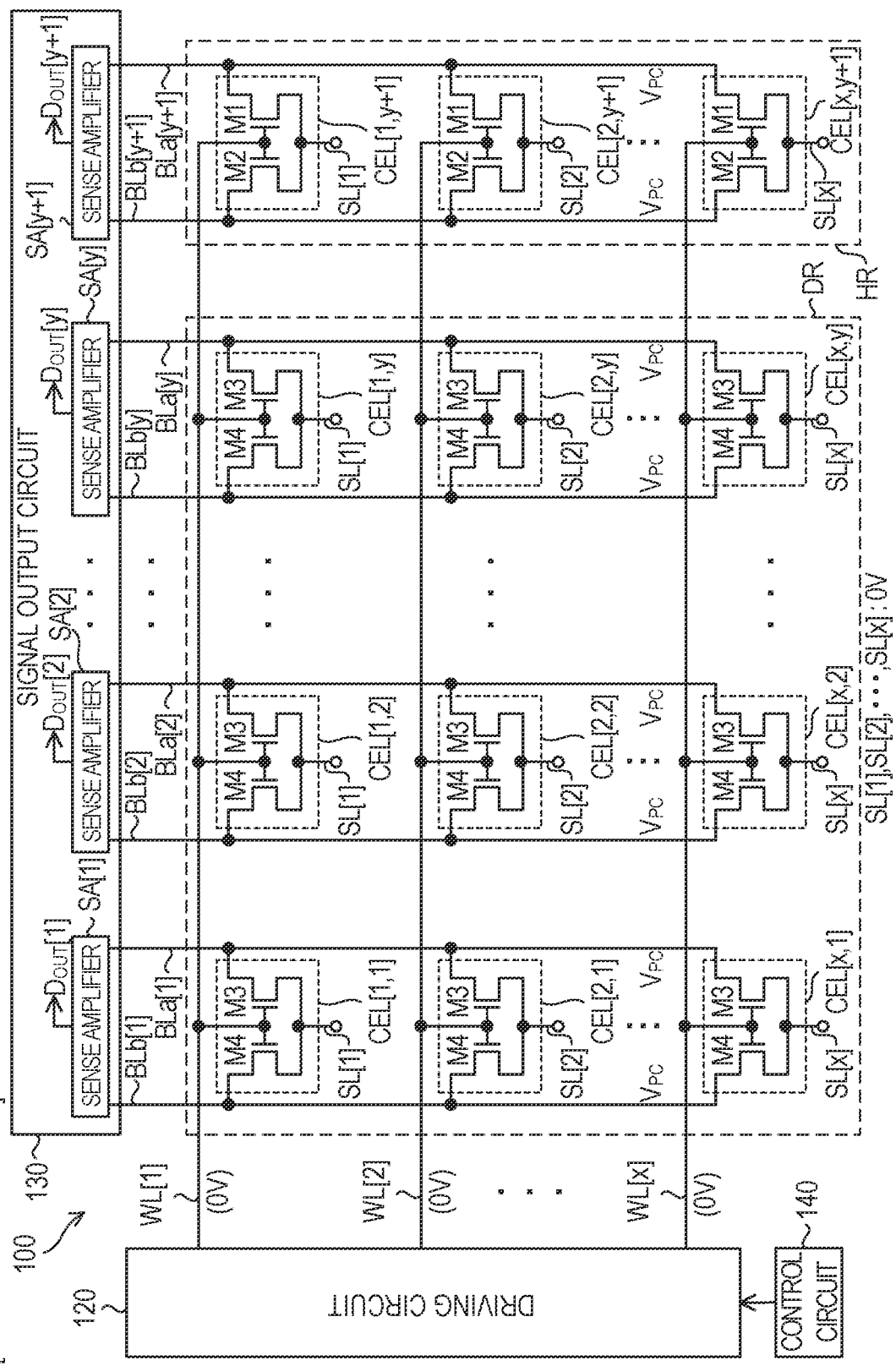

FIG. 21 is a diagram illustrating voltage states in the memory array in the precharge period, according to the second embodiment of the present disclosure.

Figure 22:
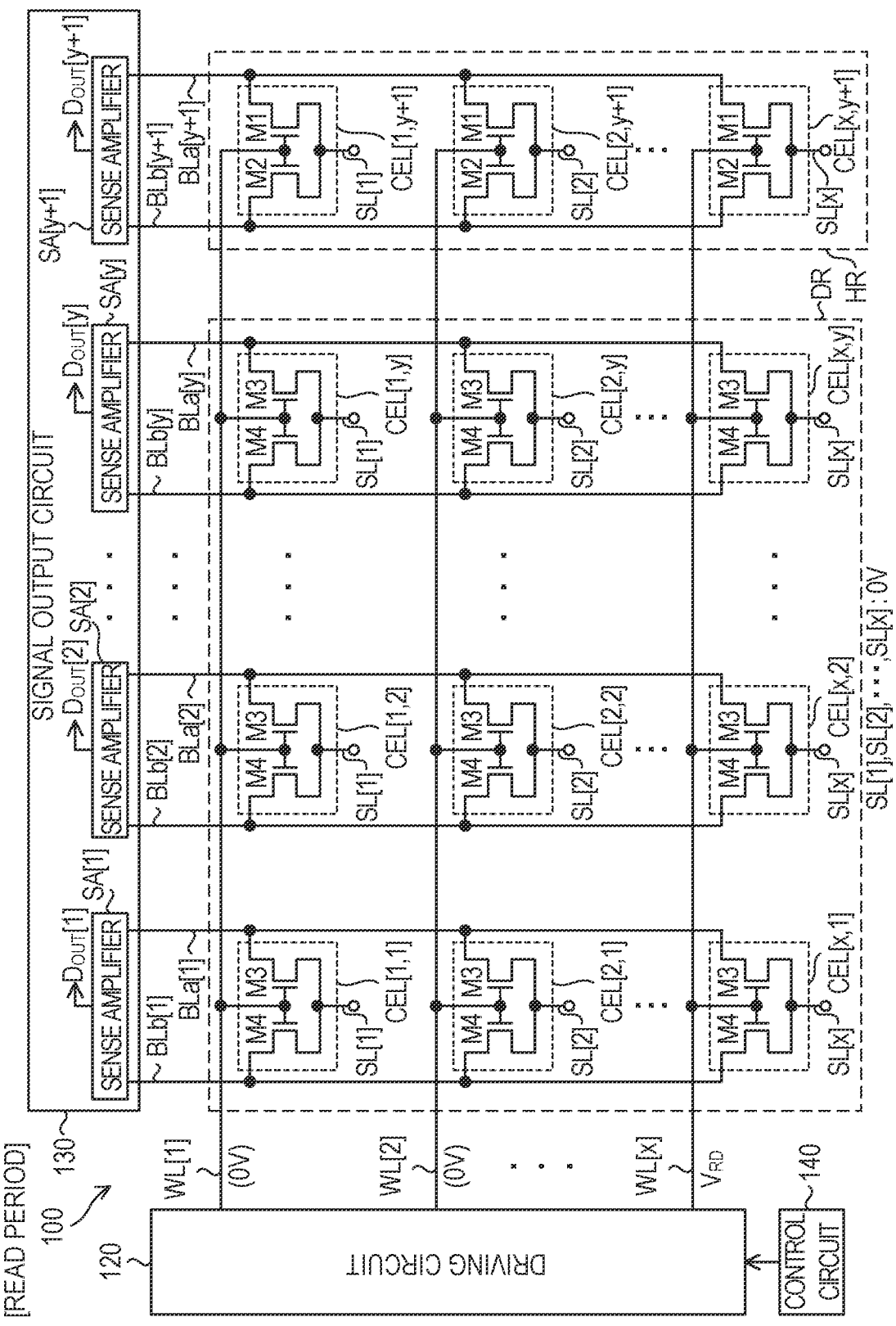

FIG. 22 is a diagram illustrating voltage states in the memory array in the read period, according to the second embodiment of the present disclosure.

Figure 23:
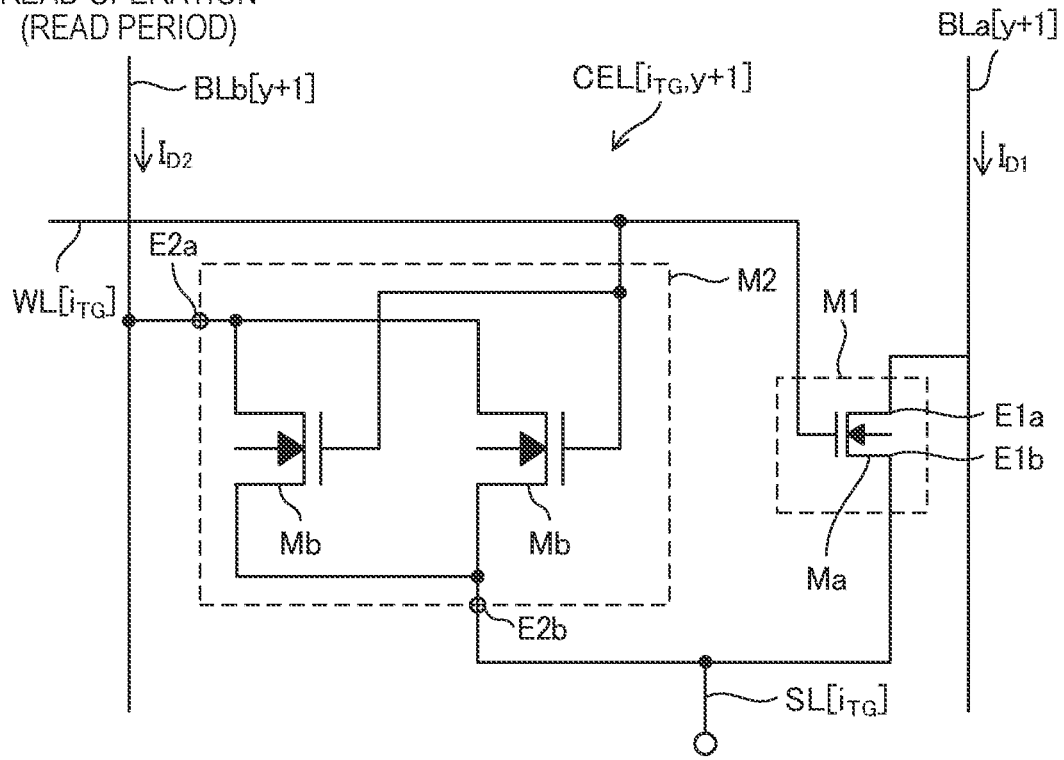

FIG. 23 is a diagram illustrating voltages and currents in the history memory cell in the read operation, according to the second embodiment of the present disclosure.

Figure 24:
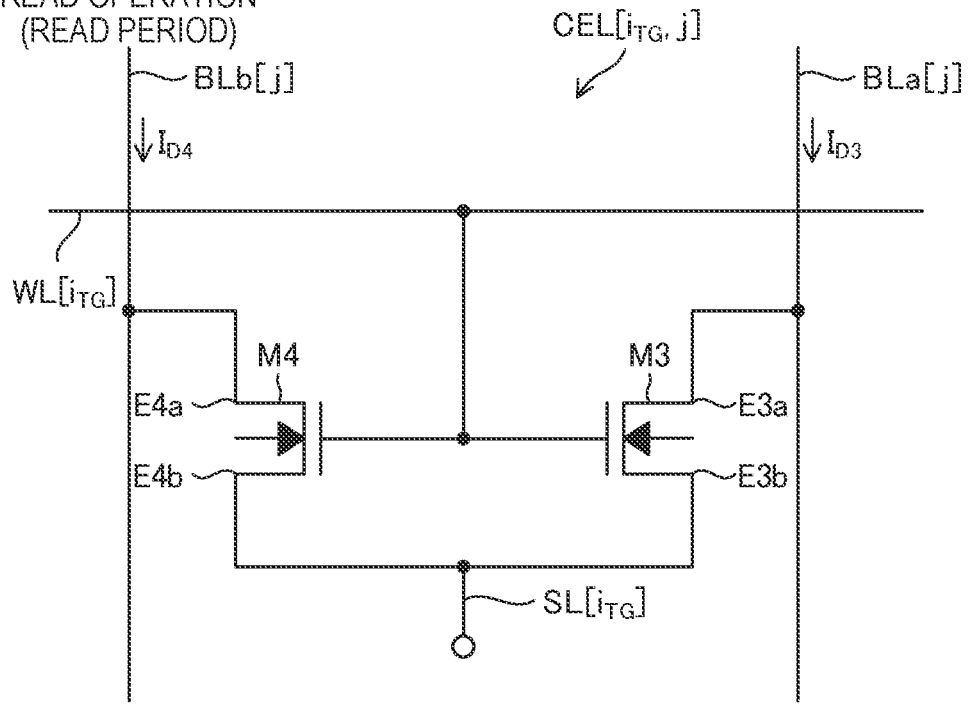

FIG. 24 is a diagram illustrating voltages and currents in the data memory cell in the read operation, according to the second embodiment of the present disclosure.

Figure 25:
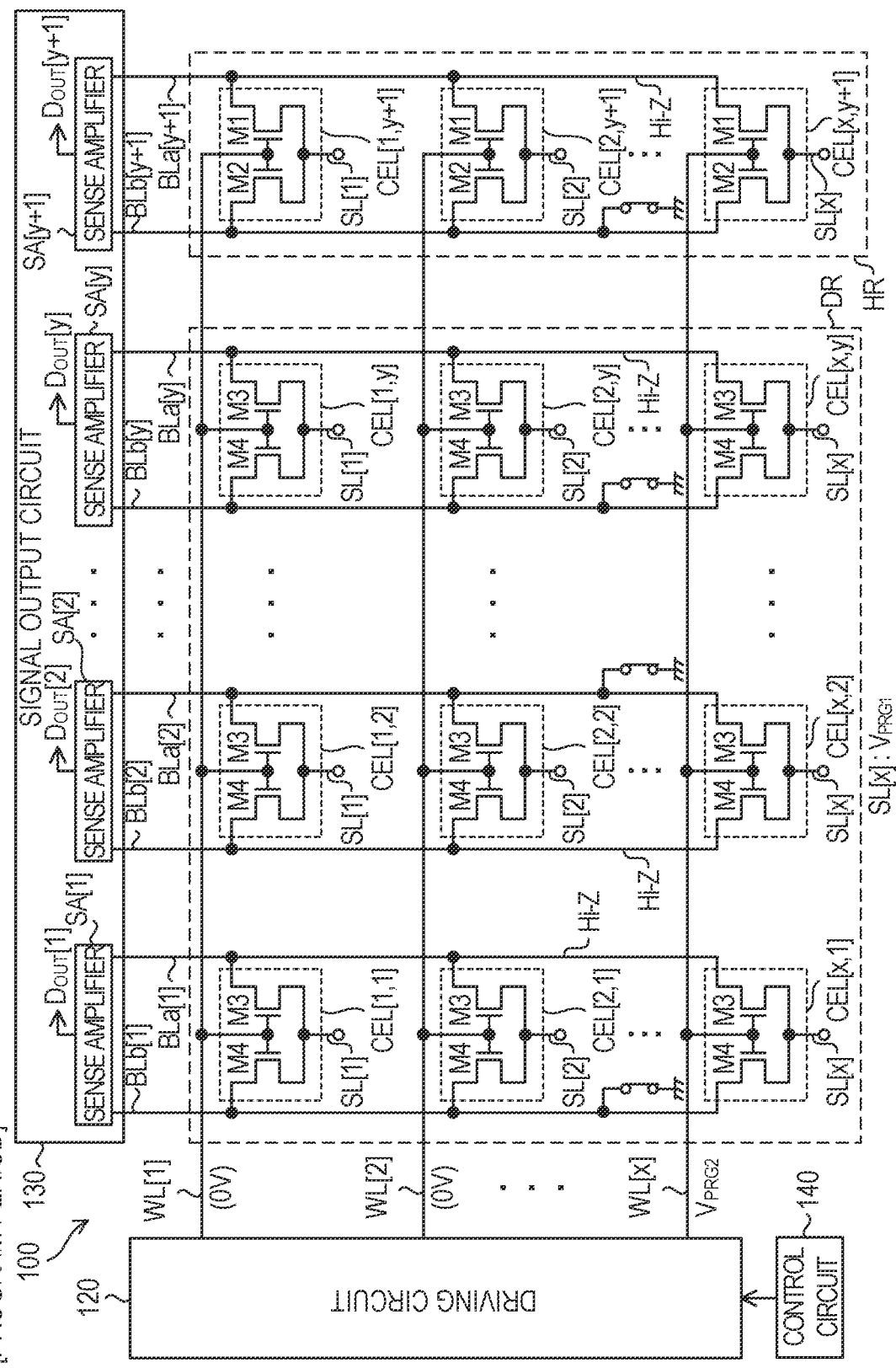

FIG. 25 is a diagram illustrating voltage states in the memory array in the program period, according to the second embodiment of the present disclosure.

DESCRIPTION OF EMBODIMENTS

Hereinafter, an example of an embodiment of the present disclosure is specifically described with reference to the drawings. In the drawings that are referred to, the same part is denoted by the same numeral or symbol, and overlapping description of the same part is omitted in principle. Note that in this specification, for simple description, a name of information, signal, physical quantity, element, part, or the like may be omitted or abbreviated by writing its numeral or symbol.

First, some terms to be used in the description of the embodiment of the present disclosure are defined as follows. Line means a wiring for transmitting or applying an electric signal. Ground means a reference conductive part having a potential of 0 V (zero volts) as a reference, or the 0 V potential itself. The reference conductive part is made of a conductor such as a metal. The 0 V potential may be referred to as ground potential. In the embodiment of the present disclosure, a voltage without a specific reference means a potential with respect to the ground. Level means a potential level. As for any noted signal or voltage, high level has a potential higher than that of low level. As for any noted signal or voltage, if the signal or voltage is at high level, it means that the level of the signal or the voltage is at high level, while if the signal or the voltage is at low level, it means that the level of the signal or the voltage is at low level. Level of a signal may be expressed as signal level, and level of a voltage may be expressed as voltage level.

As for any transistor constituted as a field effect transistor (FET), which can be a MOSFET, an on-state means a state where the drain-source channel of the transistor is conducting, while an off-state means a state where the drain-source channel of the transistor is not conducting (cut off). The same is true for other transistors that are not classified as FET. The MOSFET is understood to be an enhancement type of MOSFET unless otherwise noted. MOSFET is an abbreviation of "metal-oxide-semiconductor field-effect transistor".

Electric characteristics of a MOSFET include gate threshold voltage. In any transistor that is an N-channel type and enhancement type of MOSFET, if gate potential of the transistor is higher than source potential of the transistor, and if gate-source voltage (gate potential with respect to source potential) of the transistor is the gate threshold voltage of the transistor or higher, the transistor becomes on-state, and otherwise the transistor becomes off-state.

Any switch can be constituted of one or more field effect transistors (FETs). If a switch is in on-state, the switch is connected across the ends. If a switch in off-state, the switch is not connected across the ends. Hereinafter, on-state and off-state of any transistor or switch may be simply expressed as on and off, respectively.

First Embodiment

Figure 1:
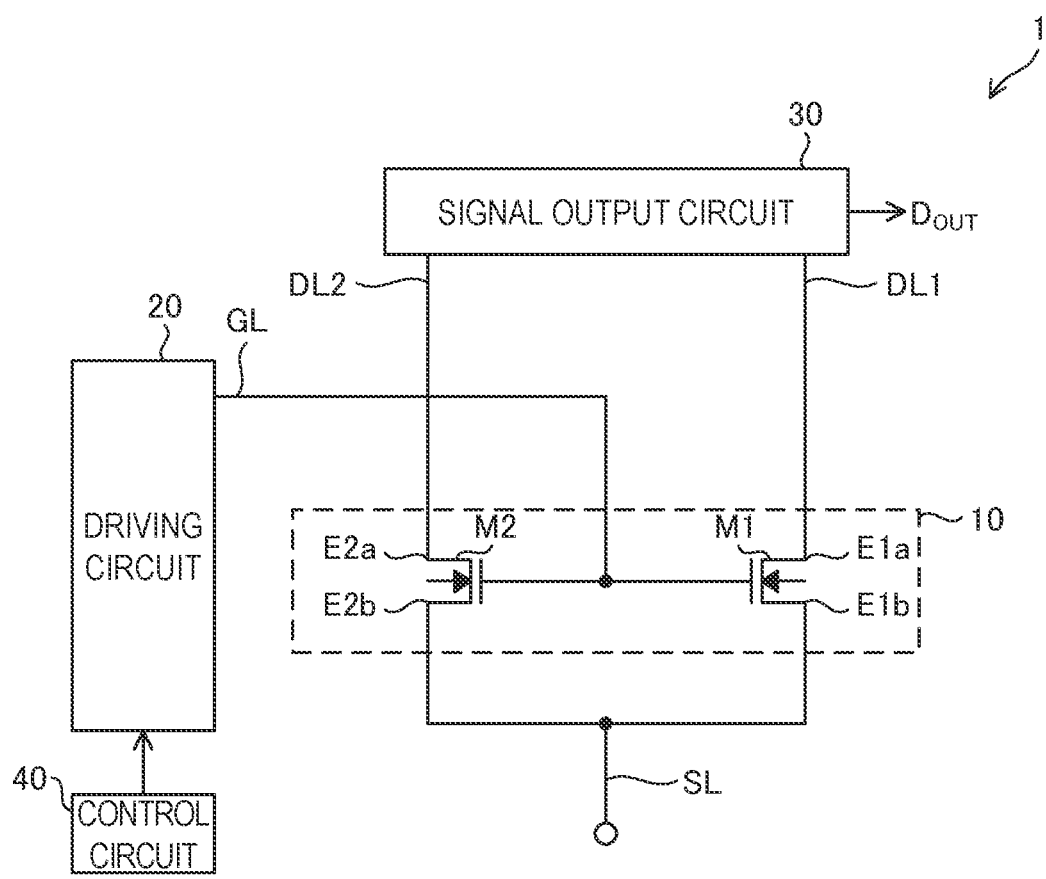
FIG. 1 is a configuration diagram of a main part of a storage circuit according to a first embodiment of the present disclosure.

A first embodiment of the present disclosure is described below. FIG. 1 is a configuration diagram illustrating a main part of a storage circuit 1 according to the first embodiment. The storage circuit 1 is a non-volatile memory to store one bit data, which includes a memory cell 10, a driving circuit 20, a signal output circuit 30, and a control circuit 40. The storage circuit 1 may be constituted of a semiconductor integrated circuit. Operations of the driving circuit 20 are controlled by the control circuit 40. Operations of the signal output circuit 30 may also be controlled by the control circuit 40.

The memory cell 10 includes memory elements M1 and M2, and the memory cell 10 stores data "0" or data "1". Each of the memory elements M1 and M2 is a transistor. Therefore, the memory elements M1 and M2 are also referred to as the transistors M1 and M2 (first and second transistors), respectively. Each of the transistors M1 and M2 is constituted as an N-channel type MOSFET.

The transistor M1 has a gate, an electrode E1a, and an electrode E1b. In the transistor M1, out of the electrode E1a and the electrode E1b, a high potential side electrode functions as a drain, and a low potential side electrode functions as a source. The transistor M2 has a gate, an electrode E2a and an electrode E2b. In the transistor M2, out of the electrode E2a and the electrode E2b, a high potential side electrode functions as a drain, and a low potential side electrode functions as a source. However, in the transistor M1, the electrode E1a is fixed as the drain, and the electrode E1b is fixed as the source. In the transistor M2, the electrode E2b functions as the source in principle, but it can function as the drain when performing a program operation described later.

In the transistors M1 and M2, the gates are commonly connected to a gate line GL. The gates of the transistors M1 and M2 are connected to the driving circuit 20 via the gate line GL. The electrode E1b of the transistor M1 and the electrode E2b of the transistor M2 are commonly connected to a line SL. The electrodes E1b and E2b basically function as the source, and the line SL may be referred to as a source line SL in the following description. The electrode E1a of the transistor M1 is connected to a line DL1, and is connected to the signal output circuit 30 via the line DL1. The electrode E2a of the transistor M2 is connected to a line DL2, and is connected to the signal output circuit 30 via the line DL2. The electrodes E1a and E2a basically function as the drain, and the lines DL1 and DL2 may be referred to as drain lines DL1 and DL2 in the following description.

In the storage circuit 1, under control by the control circuit 40, a read operation for reading data stored in the memory cell 10 and the program operation (write operation) for rewriting data (value) stored in the memory cell 10 can be performed. Note that in this embodiment, the expression "before performing program operation" and the expression "before program operation" have the same meaning, and the expression "after performing program operation" and the expression "after program operation" have the same meaning (the same is true in other embodiments described later).

In the storage circuit 1, when the read operation is performed, a precharge period is set prior to execution of the read operation, and the read operation is performed in a read period after the precharge period. In the read operation, data stored in the memory cell 10 is read out based on large/small relationship between drain currents of the transistors M1 and M2 in the read period.

Figure 2:
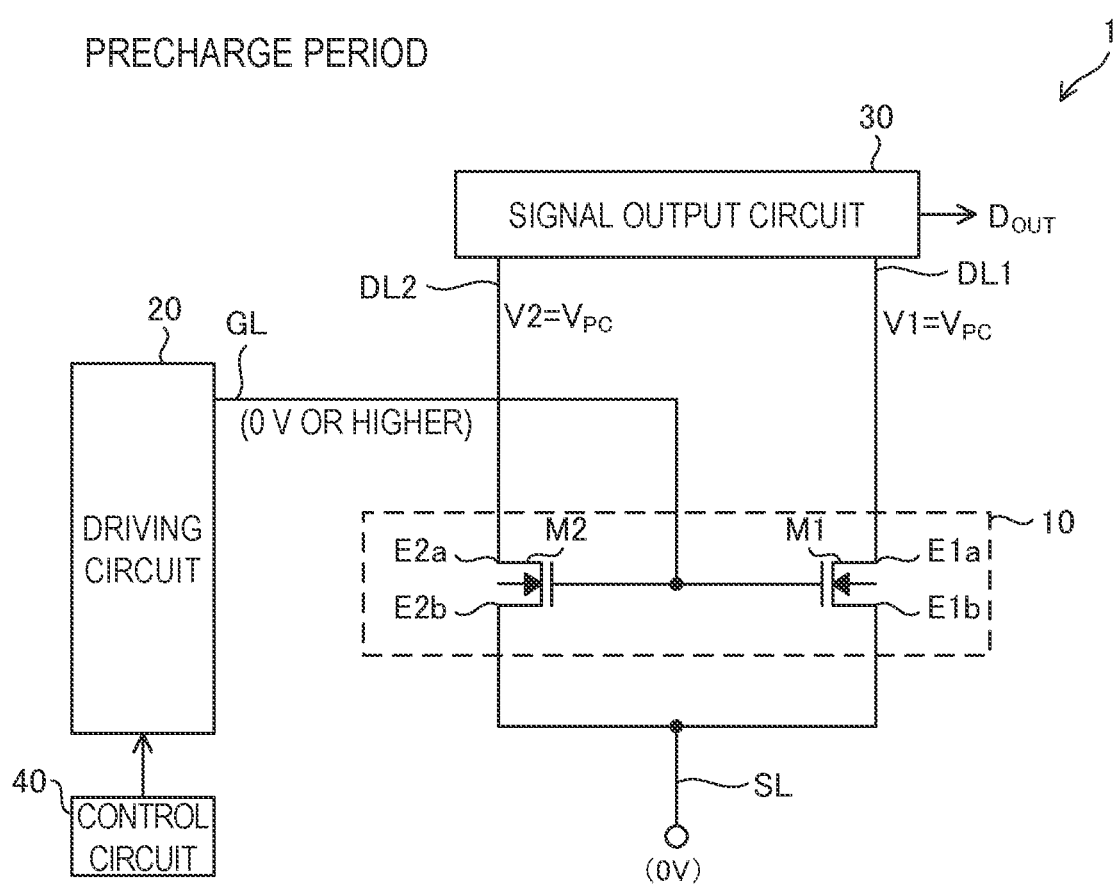
FIG. 2 is a diagram illustrating voltage states of the storage circuit in a precharge period, according to the first embodiment of the present disclosure.
Figure 3:
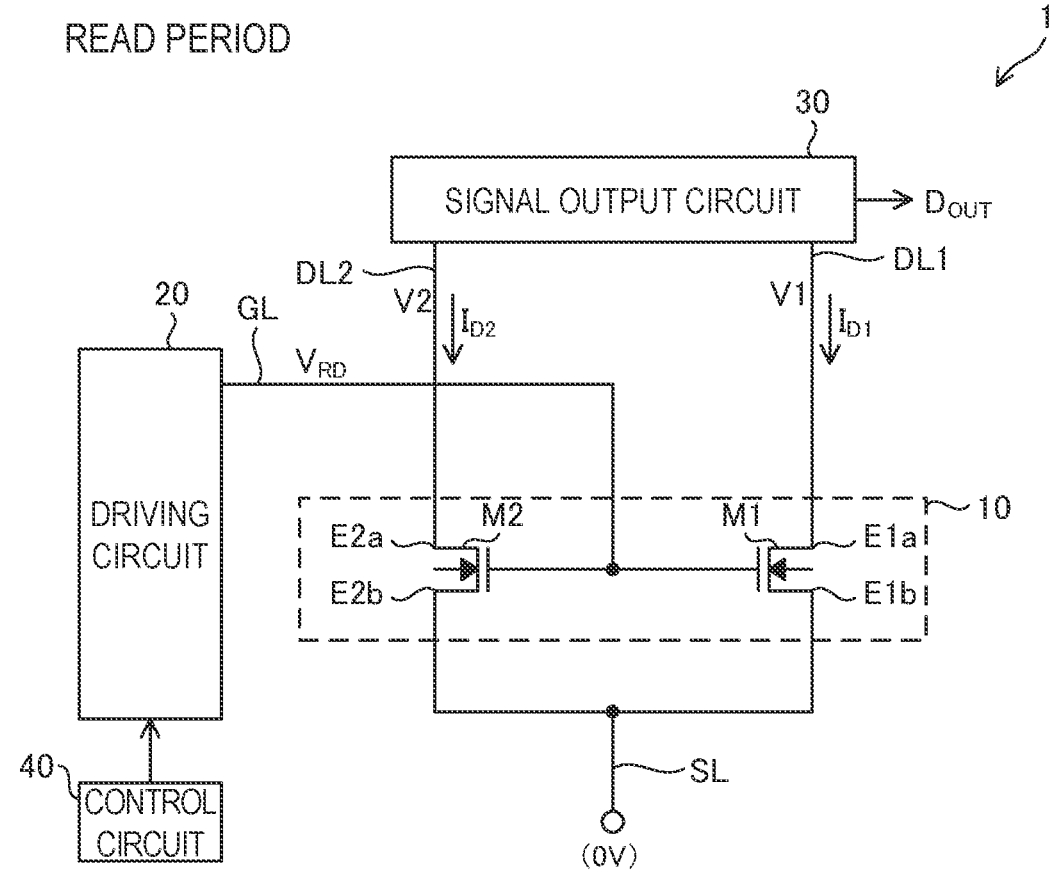
FIG. 3 is a diagram illustrating voltage states of the storage circuit in a read period, according to the first embodiment of the present disclosure.

FIGS. 2 and 3 illustrate states of voltage or current in the precharge period and in the read period. Setting and applying of voltages at individual parts in the precharge period and in the read period are performed under control by the control circuit 40. In the precharge period and in the read period, voltage of the source line SL is set to 0 V, and in the transistor M2, the electrode E2a functions as the drain while the electrode E2b functions as the source. As described above, in the transistor M1, the electrode E1a always functions as the drain while the electrode E1b always functions as the source. The voltage of the drain line DL1 is expressed as voltage V1, and the voltage of the drain line DL2 is expressed as voltage V2. In the precharge period, the driving circuit 20 sets gate voltages of the transistors M1 and M2 to 0 V, while positive charges are supplied to the drain lines DL1 and DL2, respectively, and hence common precharge voltage $V_{PC}$ is set to the voltage V1 of the drain line DL1 and the voltage V2 of the drain line DL2. The precharge voltage $V_{PC}$ has a predetermined positive DC voltage value (e.g. 1 V). The positive charge may be supplied from the signal output circuit 30 or a not-shown circuit. Note that in the precharge period, each gate of the transistors M1 and M2 may be applied with a positive voltage. However, in either case, the voltages V1 and V2 are maintained at the precharge voltage $V_{PC}$ in the precharge period.

After the precharge period, each gate of the transistors M1 and M2 is applied with positive read voltage $V_{RD}$, and the read period starts. The read voltage $V_{RD}$ may be a constant DC voltage, but may be a voltage that varies a little along with time elapsing in the read period. The read voltage $V_{RD}$ is at least higher than the gate threshold voltage of the transistor M1. The drain currents of the transistors M1 and M2 in the read period are denoted by $I_{D1}$ and $I_{D2}$, respectively. Note that in the read period, input impedance of the signal output circuit 30 viewed from the drain line DL1 and input impedance of the signal output circuit 30 viewed from the drain line DL2 are set to sufficiently high values. As a result, in the read period, the voltage V1 of the drain line DL1 is decreased only when the drain current $I_{D1}$ flows, and the voltage V2 of the drain line DL2 is decreased only when the drain current $I_{D2}$ flows.

Figure 4A:
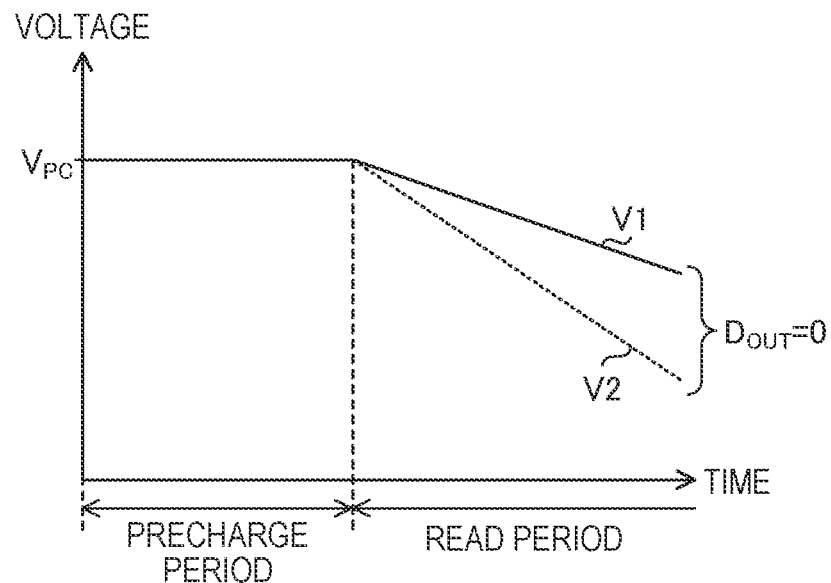
FIG. 4A is a diagram illustrating drain voltages of transistors in the precharge period and in the read period, according to the first embodiment of the present disclosure.
Figure 4B:
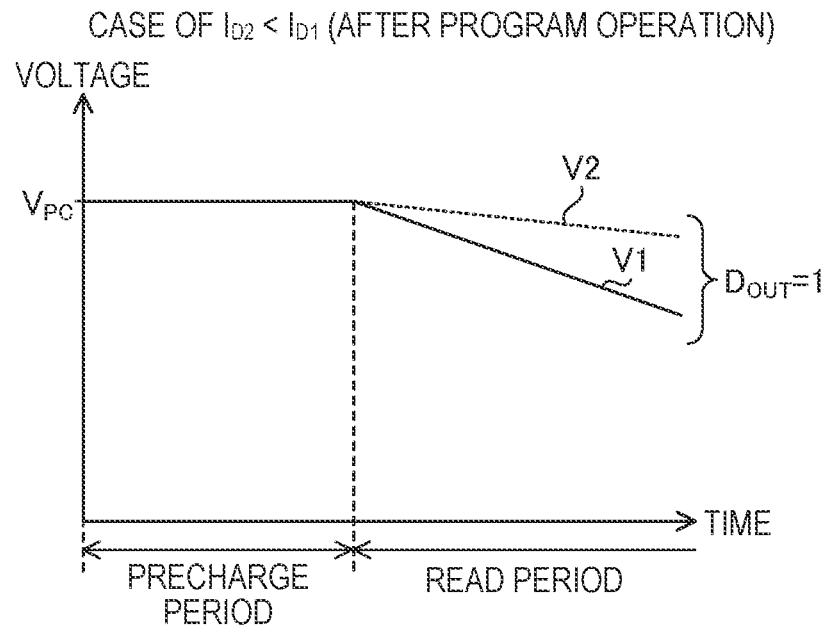
FIG. 4B is a diagram illustrating drain voltages of transistors in the precharge period and in the read period, according to the first embodiment of the present disclosure.

FIG. 4A schematically illustrates behaviors of the voltages V1 and V2 in the precharge period and in the read period when $I_{D2}>I_{D1}$ holds in the read period. FIG. 4B schematically illustrates behaviors of the voltages V1 and V2 in the precharge period and in the read period when $I_{D2}<I_{D1}$ holds in the read period. The signal output circuit 30 outputs a signal $D_{OUT}$ corresponding to a data value stored in the memory cell 10, on the basis of large/small relationship between drain currents of the transistors M1 and M2 in the read operation.

In the read operation (i.e., in the read period), the state where the drain current $I_{D2}$ is larger than the drain current $I_{D1}$ corresponds to the state where a first value is stored in the memory cell 10. Therefore, in the read operation, if the drain current $I_{D2}$ is larger than the drain current $I_{D1}$, the signal output circuit 30 outputs the signal $D_{OUT}$ associated with the first value (i.e., the signal $D_{OUT}$ indicating the first value). In the read operation (i.e., in the read period), the state where the drain current $I_{D1}$ is larger than the drain current $I_{D2}$ corresponds to the state where a second value is stored in the memory cell 10. Therefore, in the read operation, if the drain current $I_{D1}$ is larger than the drain current $I_{D2}$, the signal output circuit 30 outputs the signal $D_{OUT}$ associated with the second value (i.e., the signal $D_{OUT}$ indicating the second value). Here, it is supposed that the first value is "0" while the second value is "1".

In the storage circuit 1, before performing the program operation, the first value (0) as an initial value is stored in the memory cell 10, and after performing the program operation, the second value (1) is stored in the memory cell 10. In order to store the first value (0) as the initial value in the memory cell 10, the transistors M1 and M2 have different structures so that $I_{D2}>I_{D1}$ holds in the read operation before the program operation. Therefore, consequently, the read voltage $V_{RD}$ is higher not only than the gate threshold voltage of the transistor M1 but also than the gate threshold voltage of the transistor M2 before the program operation.

In the program operation, hot carriers are injected into only the transistor M2 out of the transistors M1 and M2, and hence the gate threshold voltage of the transistor M2 increases. The program operation is performed so that the gate threshold voltage of the transistor M2 becomes sufficiently higher than the gate threshold voltage of the transistor M1 after performing the program operation. The gate threshold voltage of the transistor M2 after performing the program operation may be higher than the read voltage $V_{RD}$.

In the read operation performed before the program operation, $I_{D2}>I_{D1}$ holds as illustrated in FIG. 4A, and as a result, the signal $D_{OUT}$ indicating the first value (0) is output, i.e., data (value) "0" stored in the memory cell 10 is read out. In the read operation performed after the program operation, along with increase in the gate threshold voltage of the transistor M2 by the program operation, $I_{D2}<I_{D1}$ holds as illustrated in FIG. 4B, and as a result, the signal $D_{OUT}$ indicating the second value (1) is output, i.e., data (value) "1" stored in the memory cell 10 is read out.

Hereinafter, it is supposed that the signal $D_{OUT}$ at low level indicates the first value (0), and the signal $D_{OUT}$ at high level indicates the second value (1). Then, for example, after the read period starts, either one of the voltages V1 and V2 that first becomes a predetermined voltage or lower is specified, and thus the signal output circuit 30 determines the level of the signal $D_{OUT}$. If the specified voltage is the voltage V2, it means that $I_{D2}>I_{D1}$ holds, and hence the signal $D_{OUT}$ at low level (the signal $D_{OUT}$ indicating value "0") is output. If the specified voltage is the voltage V1, it means that $I_{D2}<I_{D1}$ holds, and hence the signal $D_{OUT}$ at high level (the signal $D_{OUT}$ indicating value "1") is output. Alternatively, for example, timing after a predetermined time has elapsed from start of the read period is set as read timing, and large/small relationship between the drain currents $I_{D1}$ and $I_{D2}$ may be detected by detecting large/small relationship between the voltages V1 and V2 at the read timing.

Figure 5:
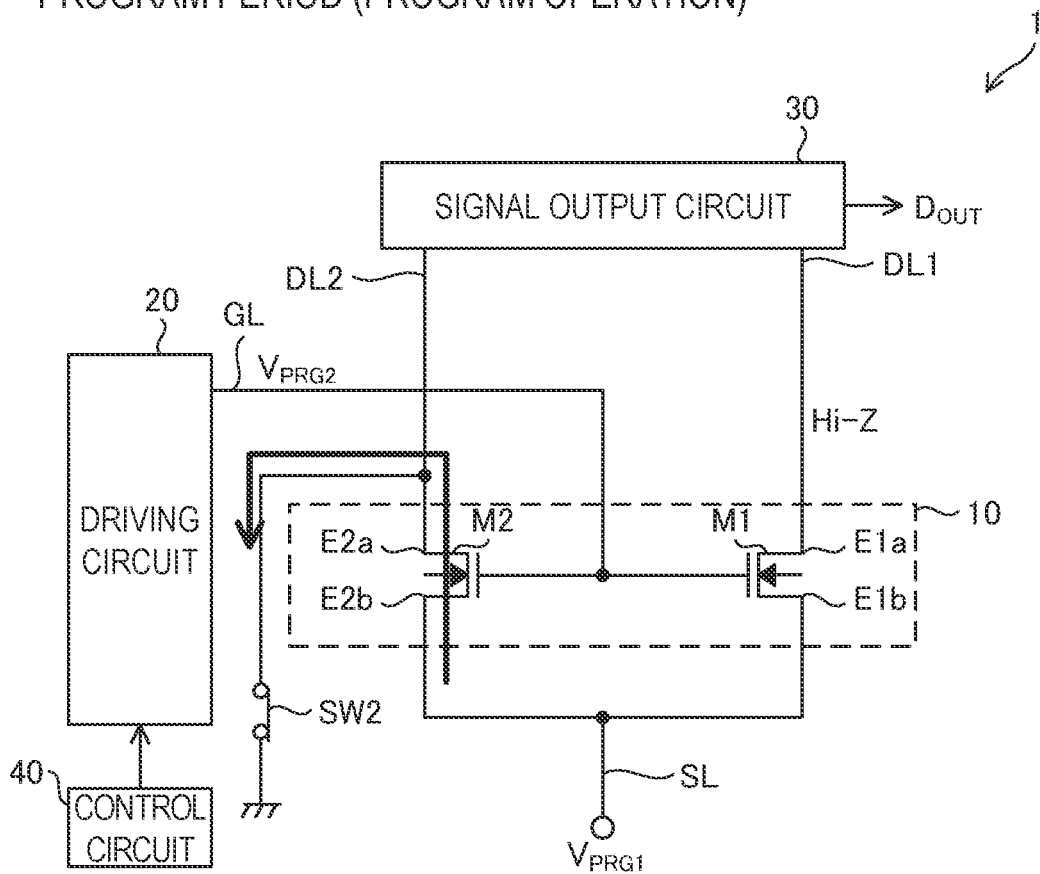
FIG. 5 is a diagram illustrating voltage states of the storage circuit in a program period, according to the first embodiment of the present disclosure.

The program operation is further described below. In the program operation, the storage circuit 1 injects hot carriers into only the transistor M2 out of the transistors M1 and M2, so as to change electric characteristics of the transistor M2. This change causes the gate threshold voltage of the transistor M2 to increase (rise). FIG. 5 illustrates voltage states of the storage circuit 1 in the program period in which the program operation is performed. Setting and applying of voltages at individual parts in the program period are performed under control by the control circuit 40.

In the program operation (i.e., in the program period), a positive voltage $V_{PRG1}$ is applied to the line SL, and the driving circuit 20 applies a positive voltage $V_{PRG2}$ to each gate of the transistors M1 and M2. Application of the voltage $V_{PRG1}$ to the line SL may also be realized by the driving circuit 20. The voltage $V_{PRG2}$ may have the same voltage value as the read voltage $V_{RD}$, or may be higher than the read voltage $V_{RD}$. It does not matter whether or not the voltages $V_{PRG1}$ and $V_{PRG2}$ have the same value. In the program operation, as long as the gate threshold voltage of the transistor M2 can be increased by a necessary amount, levels of the voltages $V_{PRG1}$ and $V_{PRG2}$ are arbitrary.

In addition, although not illustrated in FIG. 1 and others, a switch SW2 is inserted between the electrode E2a of the transistor M2 and the ground. The control circuit 40 controls on/off of the switch SW2. It may be possible to consider that the switch SW2 is contained in the driving circuit 20. The switch SW2 is in off-state in principle, but only in the program period the switch SW2 is turned on. Therefore, in the program operation (i.e., in the program period), the electrode E2b functions as the drain while the electrode E2a functions as the source in the transistor M2, and current flows from the line SL to the ground through the electrode E2b and E2a and the switch SW2. In this current flowing process, hot carriers are injected into the transistor M2 so that characteristics of the transistor M2 are changed, and the gate threshold voltage of the transistor M2 increases. The program period is sustained for a time necessary for sufficiently increasing the gate threshold voltage of the transistor M2, and then the program operation is finished. It is preferred that the voltages $V_{PRG1}$ and $V_{PRG2}$ have sufficiently high voltage values so as to realize the program operation that causes the effect described above. Note that the line DL1 is in high impedance state in the program period. It may be possible to consider that the voltage $V_{PRG2}$ is applied to the line DL1 in the program period. In any case, current does not flow between the electrodes E1a and E1b in the program period.

The method for realizing the program operation can be any method without limiting to the above method. Therefore, for example, it may be possible to realize the program operation by applying the voltage $V_{PRG2}$ to each gate of the transistors M1 and M2 in the program period, while applying the voltage $V_{PRG1}$ only to the line DL2 out of the lines DL1 and DL2, and by applying the ground potential to the line SL. In this case, the switch SW2 is maintained in off-state, and the line DL1 is applied with the ground potential or it is in high impedance state. In this way, too, hot carriers are injected only into the transistor M2 out of the transistors M1 and M2. Note that in this case, also in the program operation, similarly to the read operation, the electrode E2a functions as the drain while the electrode E2b functions as the source.

Figure 6:
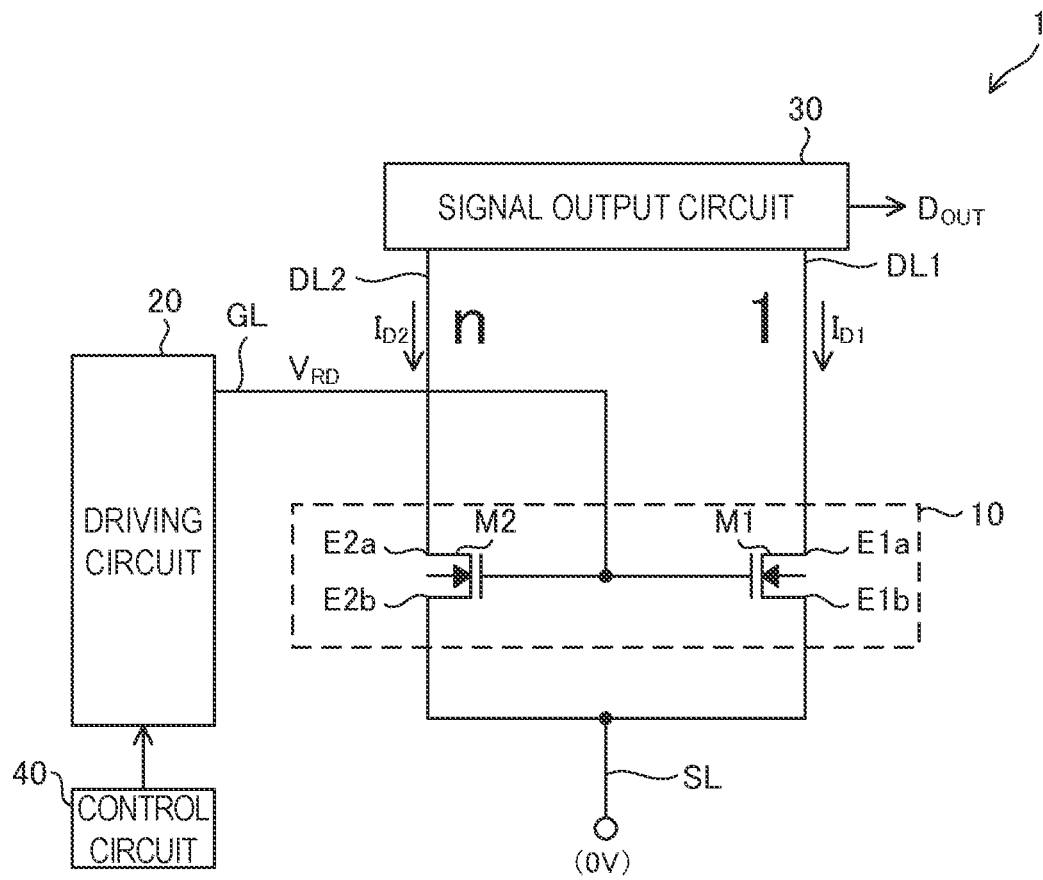
FIG. 6 is a diagram illustrating a drain current ratio between two transistors in a read operation before a program operation, according to the first embodiment of the present disclosure.

As illustrated in FIG. 6, in the read operation (read period) before the program operation, ratio between the drain current $I_{D2}$ and the drain current $I_{D1}$ is expressed by n:1. Here, n is a real number larger than 1. Further, n may be an integer or may include a decimal. While considering influences of temperature fluctuation, manufacturing error, and the like, a value properly larger than 1 is set to n so that the initial value (0) can be read stably from the memory cell 10 before the program operation. For instance, the design value of n is "4".

Note that in the following description in the first embodiment, for avoiding complicated description, unless otherwise necessary, existence of the program operation is ignored, it is considered that the electrode E1a is the drain while the electrode E1b is the source out of the electrodes of the transistor M1, and it is considered that the electrode E2a is the drain while the electrode E2b is the source out of the electrodes of the transistor M2.

[First Method]

As a method for realizing n>1, there is a first method as follows. With an example in which n=4 holds, structures of the transistors M1 and M2 according to the first method are described. As illustrated in FIG. 7, in the first method, using five unit transistors Ma having the same structure, the transistors M1 and M2 are formed. Each unit transistor Ma is an N-channel type MOSFET. The storage circuit 1 including the five unit transistors Ma is integrated on a semiconductor substrate. When the five unit transistors Ma are referred to as first to fifth unit transistors Ma, the transistor M1 is the first unit transistor Ma itself, and the transistor M2 is constituted of a parallel circuit of the second to fifth unit transistors Ma. More specifically, gates of the second to fifth unit transistors Ma are commonly connected so as to form the gate of the transistor M2, and drains of the second to fifth unit transistors Ma are commonly connected so as to form the drain of the transistor M2, and sources of the second to fifth unit transistors Ma are commonly connected so as to form the source of the transistor M2.

As for transistors, the structure is a concept including size of the transistor. Therefore, if a plurality of transistors have the same structure, it means that the transistors have the same size. If a plurality of transistors have the same structure, and if hot carrier injection by the program operation is not performed on a part or the whole of the transistors, the transistors have the same electric characteristics (including gate threshold voltage and the like). However, if a plurality of transistors have the same structure or electric characteristics, it means that they are the same by design, and they can include errors in reality (i.e., "the same" should be understood as a concept including error).

According to the first method illustrated in FIG. 7, before the program operation, the ratio between the drain current $I_{D2}$ and the drain current $I_{D1}$ can be stably set to n:1 (here, n=4). In other words, error exists inevitably, but there is a merit that the current ratio between the drain currents $I_{D2}$ and $I_{D1}$ before the program operation can be easily achieved as designed.

Figure 8:
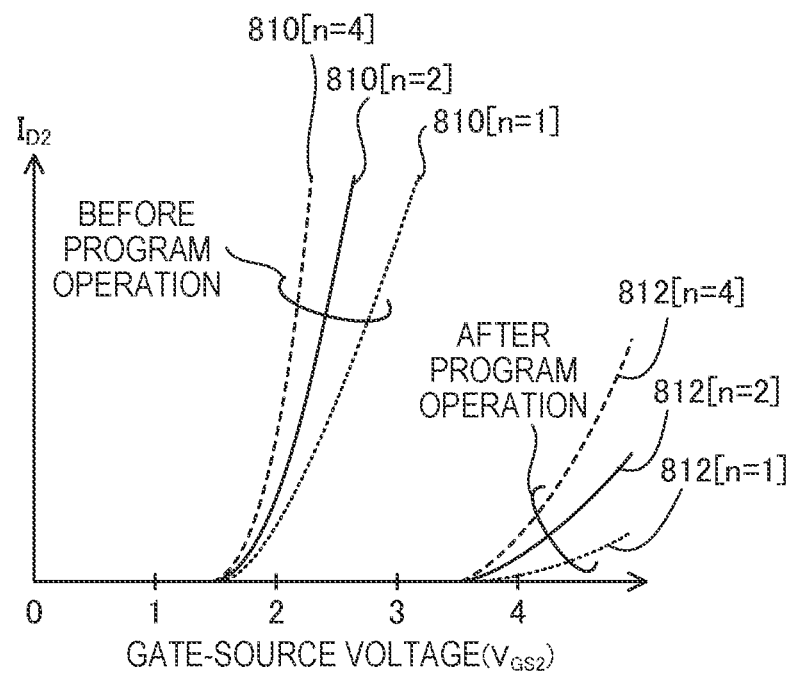
FIG. 8 is a diagram illustrating characteristics of the transistor corresponding to the configuration of FIG. 7 (first method).

FIG. 8 illustrates relationship between the gate-source voltage and the drain current $I_{D2}$ of the transistor M2 in the case where the first method is adopted. The gate-source voltage of the transistor M2 is expressed as voltage $V_{GS2}$. In FIG. 8, waveform 810[n=4] indicates relationship between the voltage $V_{GS2}$ and the drain current $I_{D2}$ before the program operation, and waveform 812[n=4] indicates relationship between the voltage $V_{GS2}$ and the drain current $I_{D2}$ after the program operation. FIG. 8 also illustrates waveforms 810[n=2], 812[n=2], 810[n=1], and 812[n=1]. The waveforms 810[n=2] and 812[n=2] respectively indicate relationship between the voltage $V_{GS2}$ and the drain current $I_{D2}$ before the program operation, and relationship between the voltage $V_{GS2}$ and the drain current $I_{D2}$ after the program operation, in the case where the transistor M2 is supposed to be constituted of a parallel circuit of two unit transistors Ma. The waveform 810[n=1] and 812[n=1] respectively indicate relationship between the voltage $V_{GS2}$ and the drain current $I_{D2}$ before the program operation, and relationship between the voltage $V_{GS2}$ and the drain current $I_{D2}$ after the program operation, in the case where the transistor M2 is supposed to be constituted of the single unit transistor Ma.

Figure 9:
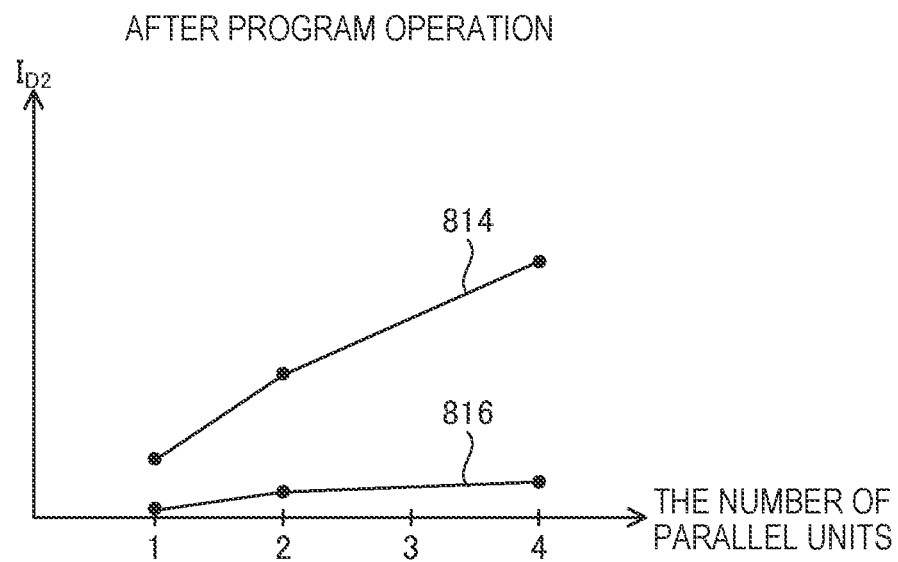
FIG. 9 is a diagram illustrating characteristics of the transistor corresponding to the configuration of FIG. 7 (first method).

Line graphs 814 and 816 in FIG. 9 indicate relationships between the number of parallel unit transistors Ma constituting the transistor M2 and the drain current $I_{D2}$ after the program operation, in the case where the first method is adopted. To acquire data for the line graph 814, the gate-source voltage of the transistor M2 was fixed to a predetermined voltage (here, 5 V). To acquire data for the line graph 816, the gate-source voltage of the transistor M2 was fixed to another predetermined voltage (here, 4 V). In the case where the first method is adopted, it is understood that the drain current $I_{D2}$ after the program operation increases in proportion to n, because the transistor Ma is constituted of a parallel circuit of n unit transistors Ma.

[Second Method]

As a method for realizing n>1, there is also a second method as follows. In the second method, as illustrated in FIG. 10, the transistor M1 is constituted of the single unit transistor Ma, while the transistor M2 is constituted of a single unit transistor Mb. Similarly to the unit transistor Ma, the unit transistor Mb is an N-channel type MOSFET, and the unit transistor Mb has a gate width W larger than that of the unit transistor Ma. The gate width W of the unit transistor Mb is particularly referred to as gate width Wb, while the gate width W of the unit transistor Ma is particularly referred to as gate width Wa. Wb>Wa holds. In FIG. 10, the unit transistor Mb is drawn larger than the unit transistor Ma, so as to schematically indicate difference of the gate width W (the same is true in FIG. 16 and others that are referred to later). In the second method, the transistor M1 is the unit transistor Ma itself, and the gate width W of the transistor M1 is Wa. The transistor M2 is the unit transistor Mb itself, and the gate width W of the transistor M2 is Wb.

Figure 11:
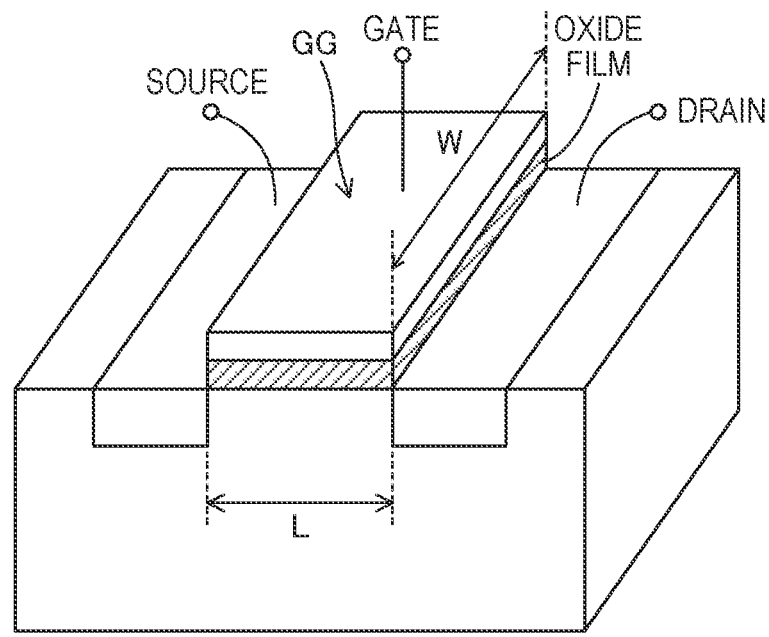
FIG. 11 is a diagram illustrating a structure of a MOSFET.

A gate width of MOSFET is defined and recognized as technical common sense of MOSFET, but description about the gate width is added below. FIG. 11 schematically illustrates a structure of MOSFET. The circuit elements of the storage circuit 1 are formed and integrated on a semiconductor substrate, and a structure of any transistor formed as a MOSFET on the semiconductor substrate is characterized by the gate width W and gate length L. Any transistor formed as a MOSFET is equipped with a gate electrode GG that functions as a gate. The gate width W and the gate length L define the size of the gate electrode GG in a direction parallel to surfaces (front and back faces) of the semiconductor substrate. Out of these, the gate length L is a distance between drain and source of the transistor (length of the gate electrode GG in the direction connecting drain and source). The gate width W is a length of the gate electrode GG in the direction perpendicular both to the direction defining the gate length L (the direction connecting drain and source) and to the normal direction of the semiconductor substrate (direction perpendicular to the front and back faces of the semiconductor substrate). As for any MOSFET, under a certain condition, the drain current increases when the gate width W increases, and drain current is generally proportional to the gate width W if the gate length L is properly large.

When Wb>Wa holds, the drain current $I_{D2}$ is larger than the drain current $I_{D1}$ in the read operation before the program operation. In this case, although depending on the gate lengths L of the unit transistors Ma and Mb too, the drain current $I_{D2}$ is approximately Wb/Wa times the drain current $I_{D1}$ in the read operation before the program operation. Note that the gate lengths L of the unit transistors Ma and Mb may have the same value.

FIG. 12 illustrates relationship between the gate-source voltage and the drain current $I_{D2}$ of the transistor M2 in the case where the second method is adopted. As described above, the gate-source voltage of the transistor M2 is referred to as the voltage $V_{GS2}$. In FIG. 12, waveforms 820[Wb=$W_L$], 820[Wb=$W_M$], and 820[Wb=$W_S$] indicate relationships between the voltage $V_{GS2}$ and the drain current $I_{D2}$ before the program operation in the conditions of Wb=$W_L$, Wb=$W_M$, and Wb=$W_S$, respectively. In FIG. 12, waveforms 822[Wb=$W_L$], 822[Wb=$W_M$], and 822[Wb=$W_S$] indicate relationships between the voltage $V_{GS2}$ and the drain current $I_{D2}$ after the program operation in the conditions of Wb=$W_L$, Wb=$W_M$, and Wb=$W_S$, respectively. In FIG. 12, the waveforms 822[Wb=$W_L$], 822[Wb=$W_M$], and 822[Wb=$W_S$] are difficult to discriminate, and they are almost the same. Here, $W_L$>$W_M$>$W_S$ holds. The gate width $W_M$ is approximately 1.5 times the gate width $W_S$, and the gate width $W_L$ is approximately 3.5 times the gate width $W_S$.

Line graphs 824 and 826 in FIG. 13 indicate relationships between the gate width Wb of the transistor M2 and the drain current $I_{D2}$ after the program operation in the case where the second method is adopted. To acquire data for the line graph 824, the gate-source voltage of the transistor M2 was fixed to a predetermined voltage (here, 5 V). To acquire data for the line graph 826, the gate-source voltage of the transistor M2 was fixed to another predetermined voltage (here, 4 V). In the case where the second method is adopted, under supposition that the gate-source voltage of the transistor M2 is constant, it is understood that the drain current $I_{D2}$ before the program operation increases along with an increase in the gate width Wb of the transistor M2, and that the drain current $I_{D2}$ after the program operation is hardly dependent on the gate width Wb of the transistor M2.

With reference to FIGS. 14A and 14B, there is described a reason why the drain current $I_{D2}$ after the program operation is hardly dependent on the gate width Wb of the transistor M2. Note that specific values of current such as 100 unit quantities, 20 unit quantities, and 400 unit quantities, which are used in description of the reason, should be understood as values for convenience' sake of specific description.

When the second method is adopted, consider a case where the program operation is performed on the transistor M2 having the gate width Wb (Wb=$W_S$) (see FIG. 14A). In this case, supposing that 100 unit quantities of current flows in the transistor M2 just after start of the program operation, injection of hot carriers causes the gate threshold voltage of the transistor M2 to increase, and along with this, current flowing in the transistor M2 gradually decreases from 100 unit quantities. Further, when the current flowing in the transistor M2 decreases to 20 unit quantities, generation of hot carriers ceases, and after that the current flowing in the transistor M2 is sustained at 20 unit quantities despite of continuation of the program operation. It is considered that flowing of current of 20 unit quantities or more in the transistor M2 is a condition for generating hot carriers.

When the second method is adopted, consider a case where the program operation is performed on the transistor M2 having the gate width Wb (Wb=$W_L$) (see FIG. 14B). Under a certain condition, more current flows in the channel of the transistor M2 when Wb=$W_L$ holds than when Wb=$W_S$ holds. In this case, supposing that 400 unit quantities of current flows in the transistor M2 just after start of the program operation, injection of hot carriers causes the gate threshold voltage of the transistor M2 to increase, and along with this, current flowing in the transistor M2 gradually decreases from 400 unit quantities. When the current flowing in the transistor M2 decreases to 80 unit quantities, hot carriers are still generated, and the gate threshold voltage of the transistor M2 further increases due to continuation of the program operation. Further, when the current flowing in the transistor M2 decreases to 20 unit quantities, generation of hot carriers ceases, and after that the current flowing in the transistor M2 is sustained at 20 unit quantities despite of continuation of the program operation.

In this way, when the second method is adopted, it is found that the drain current $I_{D2}$ after the program operation becomes substantially constant while hardly depending on the gate width Wb of the transistor M2, if the program period is sufficiently long.

[Achievement of n:1 and 1/n:1 According to First Method]

Consider that the storage circuit 1 is required to satisfy the necessary condition, which is to achieve $I_{D2}:I_{D1}\geq n:1$ before the program operation and to achieve $I_{D2}:I_{D1}\leq 1/n:1$ after the program operation, in order to stably read the first value (0) from the memory cell 10 before the program operation, and to stably read the second value (1) from the memory cell 10 after the program operation. For specific description, n=4 is exemplified.

If the structure of FIG. 7 according to the first method is used, $I_{D2}:I_{D1}=4:1$ holds before the program operation (see FIG. 15A). In this case, in order to satisfy the necessary condition described above, it is necessary to satisfy $I_{D2}:I_{D1}\leq 1/4:1$ after the program operation. In other words, if the drain current of each unit transistor Ma of the transistor M2 in the read operation is 1 unit quantity before the program operation, it is required to be decreased to 1/16 unit quantities after the program operation (see FIG. 15B). Achievement of this requirement is not easy. If the gate width W of each unit transistor Ma of the transistor M2 is set to the gate $W_L$ illustrated in the example of FIG. 14B, it is possible to reduce to 1/16 (because 20/400<1/16), but this is not practical because it is necessary to prepare five unit transistors Ma of a large size.

In this way, although the first method has a merit that the current ratio between the drain currents $I_{D2}$ and $I_{D1}$ before the program operation can be easily realized as designed, it is difficult to achieve $I_{D2}:I_{D1}\leq 1/n:1$ after the program operation.

[Third Method]

Therefore, a third method is studied as a combination method of the first method and the second method. In the storage circuit 1 according to the first embodiment, the third method as below is adopted in reality. In the third method, as illustrated in FIG. 16, the single unit transistor Ma constitutes the transistor M1 while a parallel circuit of m unit transistors Mb constitutes the transistor M2. Here, m is an arbitrary integer of 2 or more. The m unit transistors Mb constituting the transistor M2 have the same structure. In the third method, gates of the m unit transistors Mb are commonly connected to form the gate of the transistor M2, drains of the m unit transistors Mb are commonly connected to form the drain of the transistor M2, and sources of the m unit transistors Mb are commonly connected to form the source of the transistor M2. As described above, the gate width Wb that is the gate width W of each unit transistor Mb is larger than the gate width Wa that is the gate width W of the unit transistor Ma (i.e., larger than the gate width W of the transistor M1).

Suppose to satisfy the necessary condition described above when the third method is adopted. As an example, with reference to FIGS. 17A and 17B, consider the case where m=2 holds. In this case, if the gate width Wb of each unit transistor Mb of the transistor M2 is appropriately designed first, $I_{D2}:I_{D1}=4:1$ can be achieved in the read operation before the program operation. In this case, supposing that the drain currents $I_{D2}$ and $I_{D1}$ are 4 unit quantities and 1 unit quantity, respectively, the drain current of 2 unit quantities flows in each unit transistor Mb of the transistor M2 (see FIG. 17A). Further, in order to satisfy the necessary condition described above, it is sufficient to set the drain current of each unit transistor Mb of the transistor M2 to 1/8 unit quantities or smaller in the read operation after the program operation (see FIG. 17B). Reduction from 2 unit quantities to 1/8 unit quantities is reduction by 1/16. If the gate width W of each unit transistor Mb of the transistor M2 is set to the gate $W_L$ illustrated in the example of FIG. 14B, it is easy to reduce to 1/16 or smaller.

According to the storage circuit 1 adopting the third method, it is possible to enjoy the merit of the first method that the current ratio between the drain currents $I_{D2}$ and $I_{D1}$ before the program operation can be easily achieved as designed, and further to realize easily the desired current ratio between the drain currents $I_{D2}$ and $I_{D1}$ after the program operation, too. As a result, with a relatively small circuit size, it is possible to stably read the first value (0) from the memory cell 10 before the program operation and to stably read the second value (1) from the memory cell 10 after the program operation.

Second Embodiment

A second embodiment of the present disclosure is described. The second embodiment is an embodiment based on the first embodiment. As for matters that are not particularly mentioned in the second embodiment, the description of the first embodiment is also applied to the second embodiment as long as no contradiction arises. In interpretation of description of the second embodiment, if a contradiction arises between the first and the second embodiments, description of the second embodiment may be given a higher priority.

FIG. 18 is a configuration diagram of a memory array 100 according to the second embodiment. The memory array 100 is a non-volatile memory that stores data of a plurality of bits, and has a data region DR and a history region HR, and equipped with a driving circuit 120, a signal output circuit 130, and a control circuit 140. The memory array 100 is constituted of a semiconductor integrated circuit. In the memory array 100, first to x-th addresses are defined, and data of y bits can be stored in each address. However, storing data of y bits means storing in the data region DR. The history region HR stores information whether or not data is written in a certain address in the data region DR. Here, x is an arbitrary integer of 2 or more. For instance, x=32, x=128, or x=256 holds. Also, y is an arbitrary integer of 2 or more. For instance, y=8, y=16, or y=32 holds.

The driving circuit 120 is connected to x word lines WL[1] to WL[x]. The signal output circuit 130 includes total (y+1) sense amplifiers SA[1] to SA[y+1]. Each sense amplifier is connected to two bit lines. The two bit lines connected to the sense amplifier SAW are denoted by BLa[j] and BLb[j] (j is an integer).

The data region DR is provided with (xxy) data memory cells. Among the (xxy) data memory cells in the data region DR, the data memory cell that is assigned to i-th address and is a data memory cell of j-th bit is denoted by CEL[i, j] (i and j are integers). In the data region DR, each address can store 1 word data, and 1 word includes y bits. The history region HR is provided with x history memory cells. The x history memory cells in the history region HR are associated with first to x-th address, respectively. Among the x history memory cells, the history memory cell assigned to the i-th address is denoted by CEL[i, y+1]. Note that the word line WL[i] corresponds to the gate line (GL) for the data memory cells CEL[i, 1] to CEL[i, y] and history memory cell CEL[i, y+1] (see FIG. 1). The initial value stored in each data memory cell is undefined, and the program operation is performed on the data memory cells CEL[i, 1] to CEL[i, y] so that data are written and stored in the data memory cells CEL[i, 1] to CEL[i, y]. The history memory cell CEL[i, y+1] stores whether or not data is written in the data memory cells CEL[i, 1] to CEL[i, y].

All history memory cells in the history region HR have the same structure, and each history memory cell in the history region HR has the same structure as the memory cell 10 in which the third method of the first embodiment is adopted. In other words, each history memory cell in the history region HR is constituted of the transistors M1 and M2 having the structure of the third method.

FIG. 19 illustrates a structure of one history memory cell CEL[i, y+1]. The history memory cell CEL[i, y+1] includes the transistor M1 constituted of the single unit transistor Ma and the transistor M2 constituted of a parallel circuit of the m unit transistors Mb. As described above in the first embodiment, m may be an arbitrary integer of 2 or more, and here m=2 is supposed to hold. In the history memory cell CEL[i, y+1], the gates of the m unit transistors Mb are commonly connected to form the gate of the transistor M2, the drains of the m unit transistors Mb are commonly connected to form the drain of the transistor M2, and the sources of the m unit transistors Mb are commonly connected to form the source of the constituting the transistor M2. The gate width W (Wb) of each unit transistor Mb is larger than the gate width W (Wa) of the unit transistor Ma, as described above in the first embodiment.

In the history memory cell CEL[i, y+1], the transistor M1 has the gate, the electrode E1a, and the electrode E1b, and out of the electrode E1a and the electrode E1b, the high potential side electrode functions as the drain while the low potential side electrode functions as the source. In the history memory cell CEL[i, y+1], the transistor M2 has the gate, the electrode E2a, and the electrode E2b, and out of the electrode E2a and the electrode E2b, the high potential side electrode functions as the drain while the low potential side electrode functions as the source. However, in the transistor M1, the electrode E1a is fixed to the drain while the electrode E1b is fixed to the source. In the transistor M2, the electrode E2b functions as the source in principle. However, when the program operation is performed, the electrode E2b can function as the drain.

In the history memory cell CEL[i, y+1], the gate of the transistor M1 (i.e., the gate of the unit transistor Ma) and the gate of the transistor M2 (i.e., the gates of the m unit transistors Mb) are commonly connected to the word line WL[i]. In the history memory cell CEL[i, y+1], the electrode E1b of the transistor M1 and the electrode E2b of the transistor M2 are commonly connected to the line SL[i]. The electrodes E1b and E2b basically function as the source, and the line SL[i] can be referred to as the source line SL[i] hereinafter. In the history memory cell CEL[i, y+1], the electrode E1a of the transistor M1 is connected to a bit line BLa[y+1], and is connected to the sense amplifier SA[y+1] via the bit line BLa[y+1]. In the history memory cell CEL[i, y+1], the electrode E2a of the transistor M2 is connected to a bit line BLb[y+1], and is connected to the sense amplifier SA[y+1] via the bit line BLb[y+1].

All data memory cells in the data region DR have the same structure, and each data memory cell in the data region DR is constituted of transistors M3 and M4. The transistors M3 and M4 are the N-channel type MOSFET, and have the same structure. Each of the transistors M3 and M4 may be constituted of the single unit transistor Ma, or may be other unit transistor having a different structure from the unit transistor Ma or Mb.

FIG. 20 illustrates a structure of the one data memory cell CEL[i, j]. When considering the data memory cell CEL[i, j], i and j are arbitrary integers that satisfy 1≤i≤x and 1≤j≤y. The data memory cell CEL[i, j] is constituted of the transistors M3 and M4.

In the data memory cell CEL[i, j], the transistor M3 has a gate, an electrode E3a, and an electrode E3b, and out of the electrode E3a and the electrode E3b, the high potential side electrode functions as the drain while the low potential side electrode functions as the source. In the transistor M3, the electrode E3b functions as the source in principle. However, when the program operation is performed, the electrode E3b can function as the drain. In the data memory cell CEL[i, j], the transistor M4 has a gate, an electrode E4a and an electrode E4b, and out of the electrode E4a and the electrode E4b, the high potential side electrode functions as the drain while the low potential side electrode functions as the source. In the transistor M4, the electrode E4b functions as the source in principle. However, when the program operation is performed, the electrode E4b can function as the drain.

In the data memory cell CEL[i, j], the gates of the transistors M3 and M4 are commonly connected to the word line WL[i]. In the data memory cell CEL[i, j], the electrode E3b of the transistor M3 and the electrode E4b of the transistor M4 are commonly connected to the line SL[i]. In the data memory cell CEL[i, j], the electrode E3a of the transistor M3 is connected to the bit line BLa[j], and is connected to the sense amplifier SAW via the bit line BLa[j]. In the data memory cell CEL[i, j], the electrode E4a of the transistor M4 is connected to the bit line BLb[j], and is connected to the sense amplifier SAW via the bit line BLb[j].

In the memory array 100, the read operation and the program operation (write operation) can be performed. In the read operation, data stored in the data memory cells and in the history memory cell are read out. In the program operation, data (values) stored in the data memory cells and in the history memory cell are rewritten. The read operation and the program operation are performed for each address.

[Read Operation]

The read operation in the memory array 100 is described. The read operation is realized by the driving circuit 120 and the signal output circuit 130 under control by the control circuit 140. When performing the read operation, the control circuit 140 sets one of the first to the y-th address as a read target address. The driving circuit 120 cooperates with the signal output circuit 130 to perform the read operation on each data memory cell and history memory cell corresponding to the read target address.

In the read operation, data stored in the data memory cell can be read for each data memory cell corresponding to the read target address, on the basis of large/small relationship between drain currents of the transistors M3 and M4 of the data memory cell in the read period. In addition, in the read operation, as for the history memory cell corresponding to the read target address, data stored in the history memory cell can be read on the basis of large/small relationship between drain currents of the transistors M1 and M2 during the read period. By the read operation, data stored in the data memory cells CEL[i, 1] to CEL[i, y] corresponding to the read target address are output as data signals $D_{OUT}[1]$ to $D_{OUT}[y]$ from the sense amplifiers SA[1] to SA[y], and data stored in the history memory cell CEL[i, y+1] corresponding to the read target address is output as a history signal $D_{OUT}[y+1]$ from the sense amplifier SA[y+1].

When the read operation is performed, the precharge period is set prior to execution of the read operation, and the read operation is performed in the read period after the precharge period.

Considering the case where the read target address is the $i_{TG}$-th address, the read operation on the $i_{TG}$-th address is described ($i_{TG}$ is an integer of 1 or larger and x or smaller). When the read target address is the $i_{TG}$-th address, the read operation is performed on the data memory cells CEL[$i_{TG}$, 1] to CEL[$i_{TG}$, y] and the history memory cell CEL[$i_{TG}$, y+1] corresponding to the $i_{TG}$-th address.

In this case, in the read period and in the precharge period, voltages of all source lines SL[1] to SL[x] are set to 0 V (see FIGS. 21 and 22). Therefore, in the transistor M2 of the history memory cell CEL[$i_{TG}$, y+1], the electrode E2a functions as the drain while the electrode E2b functions as the source. In the transistor M1 of the history memory cell CEL[$i_{TG}$, y+1], the electrode E1a always functions as the drain while the electrode E1b always functions as the source. Furthermore, in the data memory cells CEL[$i_{TG}$, 1] to CEL[$i_{TG}$, y], the electrodes E3a and E3b of each transistor M3 function as the drain and the source, respectively, and the electrodes E4a and E4b of each transistor M4 function as the drain and the source, respectively. Further, in the precharge period, the driving circuit 120 sets voltages of all the word lines WL[1] to WL[x] to 0 V (see FIG. 21). In addition, in the precharge period, a positive charge is applied to all bit lines BLa[1] to BLa[y+1] and BLb[1] to BLb[y+1], and voltages of the bit lines BLa[1] to BLa[y+1] and BLb[1] to BLb[y+1] are set to the same precharge voltage $V_{PC}$ (see FIG. 21). The precharge voltage $V_{PC}$ has a predetermined positive DC voltage value (e.g., 1 V). The positive charge described above may be supplied from the signal output circuit 130.

After the precharge period, as illustrated in FIG. 22, the positive read voltage $V_{RD}$ is applied only to the word line WL[$i_{TG}$] corresponding to the read target address, and the read period starts (however, a situation satisfying $i_{TG}$=x is assumed in FIG. 22). In this way, in the read operation (i.e. in the read period), the read voltage $V_{RD}$ is applied to the gates of the transistors M1 and M2 (in detail, between gate and source of each of the transistors M1 and M2) of the history memory cell CEL[$i_{TG}$, y+1] assigned to the read target address, and to the gates of the transistors M3 and M4 (in detail, between gate and source of each of the transistors M3 and M4) of all the data memory cell CEL[$i_{TG}$, 1] to [$i_{TG}$, y] assigned to the read target address. In the read period, voltages of the word lines other than the word line WL[$i_{TG}$] are maintained at 0 V. The read voltage $V_{RD}$ may be a constant DC voltage, but may be a voltage that varies a little along with time elapsing in the read period. The read voltage $V_{RD}$ is higher than at least one of the gate threshold voltages of the transistors M1 and M2, and is higher than at least one of the gate threshold voltage of the transistors M3 and M4.

In this embodiment, as illustrated in FIG. 23, the drain currents of the transistors M1 and M2 in the read period in the history memory cell CEL[$i_{TG}$, y+1] are denoted by $I_{D1}$ and $I_{D2}$, respectively. Furthermore, as illustrated in FIG. 24, the drain currents of the transistors M3 and M4 in the read period in the data memory cell CEL[$i_{TG}$, j] as one of the data memory cells CEL[$i_{TG}$, 1] to CEL[$i_{TG}$, y] are denoted by $I_{D3}$ and $I_{D4}$, respectively.

Note that in the read period, for any integer j, input impedance of the signal output circuit 130 viewed from the bit line BLa[j] and input impedance of the signal output circuit 130 viewed from the bit line BLb[j] are set sufficiently large. In addition, in the read period, voltages of the word lines other than the word line WL[$i_{TG}$] are maintained at 0 V, and all the transistors M1 to M4 corresponding to addresses other than the read target address are maintained in off-state. As a result, in the read period, in the history memory cell CEL[$i_{TG}$, y+1], the voltage of the bit line BLa[y+1] is decreased only when the drain current $I_{D1}$ flows in the transistor M1, and the voltage of the bit line BLb[y+1] is decreased only when the drain current $I_{D2}$ flows in the transistor M2. Further, in the read period, in the data memory cell CEL[$i_{TG}$, j], the voltage of the bit line BLa[j] is decreased only when the drain current $I_{D3}$ flows in the transistor M3, and the voltage of the bit line BLb[j] is decreased only when the drain current $I_{D4}$ flows in the transistor M4.

In the read operation (i.e., in the read period), the state where the drain current $I_{D2}$ is larger than the drain current $I_{D1}$ corresponds to the state where the first value is stored in the history memory cell CEL[$i_{TG}$, y+1], and the state where the drain current $I_{D1}$ is larger than the drain current $I_{D2}$ corresponds to the state where the second value is stored in the history memory cell CEL[$i_{TG}$, y+1].

Therefore, in the read operation, the sense amplifier SA[y+1] specifies large/small relationship between drain currents $I_{D1}$ and $I_{D2}$ in the history memory cell CEL[$i_{TG}$, y+1], on the basis of the voltages at the bit lines BLa[y+1] and BLb[y+1]. If the drain current $I_{D2}$ is larger than the drain current $I_{D1}$, the sense amplifier SA[y+1] outputs the history signal $D_{OUT}[y+1]$ associated with the first value (i.e., the history signal $D_{OUT}[y+1]$ indicating the first value). If the drain current $I_{D1}$ is larger than the drain current $I_{D2}$, the sense amplifier SA[y+1] outputs the history signal $D_{OUT}$[y+1] associated with the second value (i.e., the history signal $D_{OUT}$[y+1] indicating the second value). Here, the first value is "0" while the second value "1". In addition, the history signal $D_{OUT}$[y+1] at low level indicate the first value (0), and the history signal $D_{OUT}$[y+1] at high level indicates data of the second value (1).

In the read operation (i.e., in the read period), the state where the drain current $I_{D3}$ is larger than the drain current $I_{D4}$ out of the drain currents $I_{D3}$ and $I_{D4}$ of the data memory cell CEL[$i_{TG}$, j] corresponds to the state where a third value is stored in the data memory cell CEL[$i_{TG}$, j], and the state where the drain current $I_{D4}$ is larger than the drain current $I_{D3}$ corresponds to the state where a fourth value is stored in the data memory cell CEL[$i_{TG}$, j].

Therefore, in the read operation, the sense amplifier SA[1] corresponding to a first bit specifies large/small relationship between the drain currents $I_{D3}$ and $I_{D4}$ of the data memory cell CEL[$i_{TG}$, 1], on the basis of voltages at the bit lines BLa[1] and BLb[1]. If the drain current $I_{D3}$ is larger than the drain current $I_{D4}$, the sense amplifier SA[1] outputs the data signal $D_{OUT}$[1] associated with the third value (i.e., the data signal $D_{OUT}$[1] indicating the third value). If the drain current $I_{D4}$ is larger than the drain current $I_{D3}$, the sense amplifier SA[1] outputs the data signal $D_{OUT}$[1] associated with the fourth value (i.e., the data signal $D_{OUT}$[1] indicating the fourth value). Similarly, in the read operation, the sense amplifier SA[2] corresponding to the second bit specifies large/small relationship between the drain currents $I_{D3}$ and $I_{D4}$ of the data memory cell CEL[$i_{TG}$, 2], on the basis of voltages at the bit lines BLa[2] and BLb[2]. If the drain current $I_{D3}$ is larger than the drain current $I_{D4}$, the sense amplifier SA[2] outputs the data signal $D_{OUT}$[2] associated with the third value (i.e., the data signal $D_{OUT}$[2] indicating the third value). If the drain current $I_{D4}$ is larger than the drain current $I_{D3}$, the sense amplifier SA[2] outputs the data signal $D_{OUT}$[2] associated with the fourth value (i.e., the data signal $D_{OUT}$[2] indicating the fourth value).

Similar operation is performed in the sense amplifiers SA[3] to SA[y] corresponding to the third to the y-th bits. In other words, in the read operation, for each data memory cell of the read target address, data signal ($D_{OUT}$[j]) associated with the third value or the fourth value is output, on the basis of large/small relationship between the drain currents $I_{D3}$ and $I_{D4}$ of the data memory cell. Here, the third value is "0" while the fourth value is "1". In addition, for any integer j that satisfies 1≤j≤y, the data signal $D_{OUT}$[j] at low level indicates the third value (0) while the data signal $D_{OUT}$[j] at high level indicates the fourth value (1).

For any integer j that satisfies 1≤j≤y+1, the operation of the sense amplifier SAW based on voltages at the bit lines BLa[j] and BLb[j] is the same as that of the signal output circuit 30 based on voltages at the drain lines DL1 and DL2 in FIG. 1. In other words, for example, for any integer j that satisfies 1≤j≤y+1, it is sufficient that the sense amplifier SAW specifies the voltage that first becomes a predetermined voltage or lower, out of the voltages at the bit lines BLa[j] and BLb[j] after start of the read period, so as to determine level of the data signal or the history signal $D_{OUT}$[j].

[Program Operation]

The program operation in the memory array 100 is described below. The program operation is realized by the driving circuit 120 under control by the control circuit 140. Therefore, the control circuit 140 can be considered to perform the program operation using the driving circuit 120. When performing the program operation, the control circuit 140 sets one of the first to the y-th address as a write target address (i.e., a program target address). The program operation is performed on the data memory cells and the history memory cell corresponding to the write target address.

As described above, each data memory cell is constituted of the transistors M3 and M4 having the same structure. Therefore, if the same gate-source voltage is applied to the transistors M3 and M4 before the program operation, large/small relationship between the drain currents thereof is undefined, and hence data (value) read out from the data memory cell is also undefined. Therefore, in the program operation, in the data memory cells of the write target address, hot carriers are injected into either one of the transistors M3 and M4. On the other hand, in the program operation, hot carriers are surely injected into the transistor M2 of the history memory cell of the write target address, so as to write the second value (1) in the history memory cell of the write target address. In this way, the history memory cell of the write target address stores information that data are stored in the data memory cells of the write target address.

Considering the case where the write target address is the $i_{TG}$-th address, the program operation on the $i_{TG}$-th address is described ($i_{TG}$ is an integer of 1 or larger and x or smaller). When the write target address is the $i_{TG}$-th address, the program operation is performed on the data memory cells CEL[$i_{TG}$, 1] to CEL[$i_{TG}$, y] and the history memory cell CEL[$i_{TG}$, y+1] corresponding to the $i_{TG}$-th address.

The program operation on the history memory cell CEL[$i_{TG}$, y+1] is the same as the program operation on the memory cell 10 described above in the first embodiment. In other words, in the program operation on the history memory cell CEL[$i_{TG}$, y+1], hot carriers are injected only into the transistor M2 out of the transistors M1 and M2 of the history memory cell CEL[$i_{TG}$, y+1], so as to change electric characteristics of the transistor M2. This change causes the gate threshold voltage of the transistor M2 to increase. After performing the program operation in which the $i_{TG}$-th address is set as the write target address, the program operation is performed so that the gate threshold voltage of the transistor M2 becomes sufficiently higher than the gate threshold voltage of the transistor M1 in the history memory cell CEL[$i_{TG}$, y+1]. In this case, the gate threshold voltage of the transistor M2 after performing the program operation may be higher than the read voltage $V_{RD}$.

The control circuit 140 outputs write word data indicating y bit data to be written in y bit data memory cells of the write target address (here, the $i_{TG}$-th address). The write word data may be data generated by the control circuit 140 or may be data supplied from an external circuit (not shown) of the memory array 100 to the control circuit 140. In the program operation on the data memory cells CEL[$i_{TG}$, 1] to CEL[$i_{TG}$, y], hot carriers are injected into one of the transistors M3 and M4 in each data memory cell of the $i_{TG}$-th address, on the basis of the write word data.

In other words, for example, if the write word data indicates that the third value (0) should be written in the data memory cell CEL[$i_{TG}$, 1], in the program operation on the data memory cell CEL[$i_{TG}$, 1], hot carriers are injected only into the transistor M4 out of the transistors M3 and M4 of the data memory cell CEL[$i_{TG}$, 1], so as to change electric characteristics of the transistor M4. This change causes the gate threshold voltage of the transistor M4 to increase. After performing this program operation, in the data memory cell CEL[$i_{TG}$, 1], the program operation is performed so that the gate threshold voltage of the transistor M4 becomes sufficiently higher than the gate threshold voltage of the transistor M3. In this case, the gate threshold voltage of the transistor M4 after performing the program operation may be higher than the read voltage $V_{RD}$.

In addition, for example, if the write word data indicates that the fourth value (1) should be written in the data memory cell CEL[$i_{TG}$, 2], in the program operation on the data memory cell CEL[$i_{TG}$, 2], hot carriers are injected only into the transistor M3 out of the transistors M3 and M4 of the data memory cell CEL[$i_{TG}$, 2], so as to change electric characteristics of the transistor M3. This change causes the gate threshold voltage of the transistor M3 to increase. After performing this program operation, in the data memory cell CEL[$i_{TG}$, 2], the program operation is performed so that the gate threshold voltage of the transistor M3 becomes sufficiently higher than the gate threshold voltage of the transistor M4. In this case, the gate threshold voltage of the transistor M3 after performing the program operation may be higher than the read voltage $V_{RD}$.

The program operation on the data memory cells CEL[$i_{TG}$, 3] to CEL[$i_{TG}$, y] is performed similarly.

FIG. 25 illustrates an example of a state of the memory array 100 during the program period. However, in FIG. 25, an example is supposed in which $i_{TG}$=x holds, and the program operation is performed so as to write the third value (0), the fourth value (1), and the third value (0) in the data memory cell CEL[$i_{TG}$, 1], the CEL[$i_{TG}$, 2], and the CEL[$i_{TG}$, y], respectively.

The method for injecting hot carriers may be the same as in the first embodiment. In other words, in the program period in which the program operation is performed on the $i_{TG}$-th address, the positive voltage $V_{PRG1}$ is applied to the line SL[$i_{TG}$], the positive voltage $V_{PRG2}$ is applied to the word line WL[$i_{TG}$] by the driving circuit 120, and 0 V is applied to all the word lines other than the word line WL[$i_{TG}$] by the driving circuit 120 (see FIG. 25, $i_{TG}$=x is assumed in FIG. 25). Application of the voltage $V_{PRG1}$ to the line SL[$i_{TG}$] may also be realized by the driving circuit 120. In this case, the voltage $V_{PRG1}$ may be applied to all the lines SL[1] to SL[x], or 0 V may be applied to all the lines other than the line SL[$i_{TG}$] among the lines SL[1] to SL[x]. The voltages $V_{PRG1}$ and $V_{PRG2}$ are as described above in the first embodiment.

Further, in the program period described above, the bit line BLb[y+1] is short-circuited to the ground via a switch (which is always in off-state outside the program period, and is not shown in FIG. 18 or the like), and the bit line BLa[y+1] is set to open state (high impedance state) without being short-circuited to the ground. In this way, in the history memory cell CEL[$i_{TG}$, y+1], current flows from the line SL[$i_{TG}$] to the ground via the transistor M2 ($i_{TG}$=x is supposed in FIG. 25 as described above). In this current flowing process, hot carriers are injected into the transistor M2 so that characteristics of the transistor M2 changes, and the gate threshold voltage of the transistor M2 increases. The program period is maintained for a time necessary for sufficiently increasing the gate threshold voltage of the transistor M2, and then the program operation is finished.

In addition, for example, if the write word data indicates that the third value (0) should be written in the data memory cell CEL[$i_{TG}$, 1], in the program period, the bit line BLb[1] is short-circuited to the ground via the switch (which is always in off-state outside the program period, and is not shown in FIG. 18 or the like), while the bit line BLa[1] is set to open state (high impedance state) without being short-circuited to the ground. In this way, in the data memory cell CEL[$i_{TG}$, 1], current flows from the line SL[$i_{TG}$] to the ground via the transistor M4 ($i_{TG}$=x is assumed in FIG. 25 as described above). In this current flowing process, hot carriers are injected into the transistor M4 so that characteristics of the transistor M4 changes, and the gate threshold voltage of the transistor M4 increases. The program period is maintained for a time necessary for sufficiently increasing the gate threshold voltage of the transistor M4, and then the program operation is finished.

In addition, for example, if the write word data indicates that the fourth value (1) should be written in the data memory cell CEL[$i_{TG}$, 2], in the program period, the bit line BLa[2] is short-circuited to the ground via the switch (which is always in off-state outside the program period, and is not shown in FIG. 18 or the like), while the bit line BLb[2] is set to open state (high impedance state) without being short-circuited to the ground. In this way, in the data memory cell CEL[$i_{TG}$, 2], current flows from the line SL[$i_{TG}$] to the ground via the transistor M3 ($i_{TG}$=x is assumed in the example of FIG. 25 as described above). In this current flowing process, hot carriers are injected into the transistor M3 so that characteristics of the transistor M3 changes, and the gate threshold voltage of the transistor M3 increases. The program period is maintained for a time necessary for sufficiently increasing the gate threshold voltage of the transistor M3, and then the program operation is finished.

The program operation on the data memory cells CEL[$i_{TG}$, 3] to CEL[$i_{TG}$, y] is performed similarly.

As understood from the above description, the following description can be given for the read operation and the program operation noting the $i_{TG}$-th address. If the read operation is performed in the state where the $i_{TG}$-th address is set as the read target address before the program operation is performed on the $i_{TG}$-th address, the drain current ($I_{D2}$) of the transistor M2 is larger than the drain current ($I_{D1}$) of the transistor M1 in the history memory cell CEL[$i_{TG}$, y+1] of the read target address. If the read operation is performed in the state where the $i_{TG}$-th address is set as the read target address after the $i_{TG}$-th address is set as the write target address and the program operation is performed on the $i_{TG}$-th address, the gate threshold voltage of the transistor M2 increases in the history memory cell CEL[$i_{TG}$, y+1] of the read target address. Along with this, the drain current ($I_{D1}$) of the transistor M1 becomes lager than the drain current ($I_{D2}$) of the transistor M2. In each of the data memory cells CEL[$i_{TG}$, 1] to CEL[$i_{TG}$, y] of the read target address, the gate threshold voltage increases in one transistor out of the transistors M3 and M4 that is a target of the injection of hot carriers. Along with this, the drain current of the other transistor becomes larger than the drain current of the one transistor.

Note that the method for realizing the program operation is not limited to that described above, but can be any method that can inject hot carriers only into the necessary transistor.

[Utility Example of History Memory Cell and Memory Array]

In the i-th address, if the first value (0) is stored in the history memory cell CEL[i, y+1], the first value (0) means that data are not written yet in the data memory cells CEL[i, 1] to CEL[i, y]. If the second value (1) is stored in the history memory cell CEL[i, y+1], the second value (1) means that data are written in the data memory cells CEL[i, 1] to CEL[i, y].

Each of the data memory cells and the history memory cells corresponds to a one time programmable ROM (OTP) in which data can be written only once. Therefore, when setting the write target address, the control circuit 140 can set only the address whose corresponding history memory cell stores the first value (0), as the write target address.

In other words, for example, in the circumference where the second value (1) is stored only in the history memory cells CEL[1, y+1] and CEL[2, y+1] corresponding to the first and second addresses among the history memory cells CEL[1, y+1] to CEL[x, y+1], when writing new write word data in the data region DR by the program operation, the control circuit 140 sets one of the third to x-th address as the write target address (the third address can be usually set as the write target address).

Therefore, for example, the memory array 100 can be used as follows. In the initial state of the memory array 100, the first value (0) is stored in all the history memory cells CEL[1, y+1] to CEL[x, y+1], and stored values of all the data memory cells are undefined. When writing first write word data in the data region DR, the control circuit 140 sets the first address as the write target address and performs the program operation. Thus, it writes the first write word data in the data memory cells CEL[1, 1] to CEL[1, y] of the first address, and simultaneously writes the second value (1) in the history memory cell CEL[1, y+1] of the first address.

After that, when writing second write word data in the data region DR, the control circuit 140 sets the second address as the write target address and performs the program operation. Thus, it writes the second write word data in the data memory cells CEL[2, 1] to CEL[2, y] of the second address, and simultaneously writes the second value (1) in the history memory cell CEL[2, y+1] of the second address. The similar operations are performed when writing third and following write word data in the data region DR.

In reality, prior to execution of the program operation, the control circuit 140 reads the whole or a part of values stored in the history memory cells CEL[1, y+1] to CEL[x, y+1] by the read operation, and specifies the history memory cell among the history memory cells CEL[1, y+1] to CEL[x, y+1] that stores the first value (0) and corresponds to the smallest address number, and it sets the address corresponding to the specified history memory cell as the write target address. Therefore, for example, if the second value (1) is stored only in the history memory cells CEL[1, y+1] and CEL[2, y+1] among the history memory cells CEL[1, y+1] to CEL[x, y+1], it sets the third address corresponding to the history memory cell CEL[3, y+1] as the write target address.

In this way, the memory can be used as if y bit write word data can be rewritten x times. In this case, as a trade-off for allowing unstable initial stored value, each data memory cell in the data region DR can be formed in a small size. As for the history memory cell, the initial value can be defined, and further the effect of the first embodiment can be enjoyed.

<<Variations>>

Hereinafter, variations, application examples, and the like that can be applied to the first or second embodiment are described.

In the operation example described above, it is assumed that the first value is "0" while the second value is "1", but the first and second values can be any values as long as they are different to each other. In addition, it is possible to configure the circuit so that the signal $D_{OUT}$ associated with the first value (the history signal $D_{OUT}[y+1]$ in the second embodiment) becomes a high level signal, and that the signal $D_{OUT}$ associated with the second value (the history signal $D_{OUT}[y+1]$ in the second embodiment) becomes a low level signal. Similarly, in the operation example described above, it is assumed that the third value is "0" while the fourth value is "1", but the third and fourth value can be any values as long as they are different to each other. In addition, it is possible to configure the circuit so that the data signal $D_{OUT}[j]$ associated with the third value becomes a high level signal, and that the data signal $D_{OUT}[j]$ associated with the fourth value becomes a low level signal. In addition, match/mismatch between the first value and the third value or the fourth value is arbitrary, and match/mismatch between the second value and the third value or the fourth value is also arbitrary.

The non-volatile memory according to the present disclosure (the storage circuit 1 or the memory array 100) can be incorporated in any circuit or device that realizes a predetermined functional operation. When a power supply voltage is supplied to the circuit or device that incorporates the non-volatile memory so that the circuit or the device is activated, the circuit or the device reads data stored in the non-volatile memory by the read operation, and realizes a predetermined functional operation corresponding to the read data. For instance, the non-volatile memory (the storage circuit 1 or the memory array 100) is incorporated in an amplifier circuit (not shown) that can change the amplification factor according to trimming data, and one or more data stored in the non-volatile memory is supplied as the trimming data to the amplifier circuit, so that the amplification factor of the amplifier circuit can be adjusted in an optimal manner. In addition, the non-volatile memory according to the present disclosure can be incorporated in semiconductor integrated circuits of various usages, such as a semiconductor integrated circuit for a DC/DC converter, or a semiconductor integrated circuit for a motor driver. The amplifier circuit described above is an example of a circuit provided to these semiconductor integrated circuits.

The channel type of the field effect transistor (FET) described above in each embodiment is merely an example. The N-channel type FET can be changed to a P-channel type FET, or the P-channel type FET can be changed to the N-channel type FET. In this way, a circuit structure including the FET can be modified.

As long as no disadvantage occurs, any transistor described above may be any type of transistor. For instance, any transistor described above as a MOSFET can be replaced with a junction type FET, an insulated gate bipolar transistor (IGBT), or a bipolar transistor, as long as no disadvantage occurs. Any transistor has a first electrode, a second electrode, and a control electrode. In an FET, one of the first and second electrodes is a drain, the other is a source, and the control electrode is a gate. In an IGBT, one of the first and second electrodes is a collector, the other is an emitter, and the control electrode is a gate. In a bipolar transistor that does not belong to IGBT, one of the first and second electrodes is a collector, the other is an emitter, and the control electrode is a base.

The embodiment of the present disclosure can be appropriately and variously modified within the scope of the technical concept recited in the claims. The embodiment is merely an example of the embodiment of the present disclosure, and meanings of terms of the present disclosure or individual structural elements are not limited to those described in the embodiments described above. The specific numeric values mentioned in the above description are merely examples, and as a matter of course, they can be changed to various values.

<<Additional Remarks>>

The technical concepts implemented in the embodiments described above are considered below.

A non-volatile memory according to one aspect of the present disclosure includes; a memory cell having a first transistor and a second transistor; a driving circuit configured to apply a read voltage to gates of the first and second transistors; and a signal output circuit configured to output a signal associated with a first value or a signal associated with a second value, based on drain currents of the first and second transistors, in a read operation in which the read voltage is applied. The second transistor is constituted of a parallel circuit of a plurality of unit transistors, and gate width of each of the unit transistors is larger than that of the first transistor (first configuration).

In the non-volatile memory according to the first configuration, the signal output circuit may be configured to output the signal associated with the first value if the drain current of the second transistor is larger than the drain current of the first transistor, and to output the signal associated with the second value if the drain current of the first transistor is larger than the drain current of the second transistor, in the read operation (second configuration).

In the non-volatile memory according to the second configuration, a configuration may be adopted in which the memory is capable of performing a program operation to increase a gate threshold voltage of the second transistor by injecting hot carriers into the second transistor, the drain current of the second transistor is larger than the drain current of the first transistor in the read operation performed before the program operation, and the drain current of the first transistor is larger than the drain current of the second transistor in the read operation performed after the program operation, due to increase in the gate threshold voltage of the second transistor by the program operation (third configuration).

Another non-volatile memory according to the present disclosure, which is configured to store a plurality of bits of data in each of a plurality of addresses, includes a history memory cell provided for each of the addresses so as to have a first transistor and a second transistor; a plurality of data memory cells provided for each of the addresses so as to have a third transistor and a fourth transistor; a control circuit configured to set one of the addresses as a read target address; a driving circuit configured to apply a read voltage to gates of the first to fourth transistors in the history memory cell and the data memory cells assigned to the read target address; and a signal output circuit configured to output a history signal associated with a first value or a second value, based on drain currents of the first and second transistors in the history memory cell of the read target address, and to output a data signal associated with a third value or a fourth value, based on drain currents of the third and fourth transistors of the data memory cell, in each of the data memory cells of the read target address, in the read operation in which the read voltage is applied to the read target address. In the history memory cell of each address, the second transistor is constituted of a parallel circuit of a plurality of unit transistors, and gate width of each of the unit transistors is larger than that of the first transistor (fourth configuration).

In the non-volatile memory according to the fourth configuration, a configuration may be adopted in which the signal output circuit is configured so that, in the read operation for the read target address, it outputs the history signal associated with the first value if the drain current of the second transistor is larger than the drain current of the first transistor, while it outputs the history signal associated with the second value if the drain current of the first transistor is larger than the drain current of the second transistor, in the history memory cell, and it outputs the data signal associated with the third value if the drain current of the third transistor is larger than the drain current of the fourth transistor, while it outputs the data signal associated with the fourth value if the drain current of the fourth transistor is larger than the drain current of the third transistor, in each of the data memory cells of the read target address (fifth configuration).

In the non-volatile memory according to the fifth configuration, a configuration may be adopted in which the control circuit is capable of performing the program operation on the a write target address using the driving circuit after setting one of the plurality of addresses as the write target address. In the program operation on the write target address, it injects hot carriers into the second transistor in the history memory cell of the write target address so as to increase a gate threshold voltage of the second transistor, and in each of the data memory cells of the write target address, it injects hot carriers to one of the third and fourth transistors as a target, so as to increase the gate threshold voltage of the transistor as the target. If the read operation is performed in the state where a specific address is set as the read target address before the program operation is performed on the specific address, the drain current of the second transistor is larger than the drain current of the first transistor in the history memory cell of the read target address. If the read operation is performed in the state where the specific address is set as the read target address after the specific address is set as the write target address and the program operation is performed on the specific address, the drain current of the first transistor is larger than the drain current of the second transistor due to an increase in the gate threshold voltage of the second transistor in the history memory cell of the read target address, and in each of the data memory cells of the read target address, the gate threshold voltage of one transistor out of the third and fourth transistors that is a target of the injection of hot carriers increases, which causes the drain current of the other transistor to be larger than the drain current of the one transistor (sixth configuration).

In the non-volatile memory according to any one of the fourth to sixth configurations, a configuration may be adopted in which the third and fourth transistors have the same structure in each of the data memory cells of each address (seventh configuration).

Still another non-volatile memory according to the present disclosure includes a memory cell having a first transistor and a second transistor; a driving circuit configured to be capable of applying a read voltage to gates of the first transistor and the second transistor; and a signal output circuit configured to be capable of outputting a signal associated with a first value or a signal associated with a second value, based on drain currents of the first and second transistors, in the read operation in which the read voltage is applied. The second transistor is constituted of a parallel circuit of a plurality of unit transistors, and gate width of each of the unit transistors is larger than that of the first transistor (eighth configuration).

Still another non-volatile memory according to the present disclosure, which is configured to store a plurality of bits of data in each of a plurality of addresses, includes a history memory cell provided for each of the addresses so as to have a first transistor and a second transistor; a plurality of data memory cells provided for each of the addresses, so as to have a third transistor and a fourth transistor; a control circuit configured to be capable of setting one of the addresses as a read target address; a driving circuit configured to be capable of applying a read voltage to gates of the first to fourth transistors in the history memory cell and the data memory cells assigned to the read target address; and a signal output circuit configured to be capable of outputting a history signal associated with a first value or a second value, based on drain currents of the first and second transistors in the history memory cell of the read target address, and to be capable of outputting a data signal associated with a third value or a fourth value, based on drain currents of the third and fourth transistors of the data memory cell, in each of the data memory cells of the read target address, in the read operation in which the read voltage is applied for the read target address. In the history memory cell of each address, the second transistor is constituted of a parallel circuit of a plurality of unit transistors, and gate width of each of the unit transistors is larger than that of the first transistor (ninth configuration).

The invention claimed is:

1. A non-volatile memory comprising:
a memory cell having a first transistor and a second transistor;
a driving circuit configured to apply a read voltage to gates of the first and second transistors; and
a signal output circuit configured to output a signal associated with a first value or a signal associated with a second value, based on drain currents of the first and second transistors, in a read operation in which the read voltage is applied,
wherein the second transistor is constituted of a parallel circuit of a plurality of unit transistors, and gate width of each of the unit transistors is larger than that of the first transistor,
wherein the signal output circuit is configured to output the signal associated with the first value if the drain current of the second transistor is larger than the drain current of the first transistor, and to output the signal associated with the second value if the drain current of the first transistor is larger than the drain current of the second transistor, in the read operation, and
wherein
the memory is capable of performing a program operation to increase a gate threshold voltage of the second transistor by injecting hot carriers into the second transistor,
the drain current of the second transistor is larger than the drain current of the first transistor in the read operation performed before the program operation, and
the drain current of the first transistor is larger than the drain current of the second transistor in the read operation performed after the program operation, due to increase in the gate threshold voltage of the second transistor by the program operation.

2. A non-volatile memory configured to store a plurality of bits of data in each of a plurality of addresses, comprising:
a history memory cell provided for each of the addresses so as to have a first transistor and a second transistor;
a plurality of data memory cells provided for each of the addresses so as to have a third transistor and a fourth transistor;
a control circuit configured to set one of the addresses as a read target address;
a driving circuit configured to apply a read voltage to gates of the first to fourth transistors in the history memory cell and the data memory cells assigned to the read target address; and
a signal output circuit configured to output a history signal associated with a first value or a second value, based on drain currents of the first and second transistors in the history memory cell of the read target address, and to output a data signal associated with a third value or a fourth value, based on drain currents of the third and fourth transistors of the data memory cell, in each of the data memory cells of the read target address, in a read operation in which the read voltage is applied to the read target address, wherein
in the history memory cell of each address, the second transistor is constituted of a parallel circuit of a plurality of unit transistors, and gate width of each of the unit transistors is larger than that of the first transistor.

3. The non-volatile memory according to claim 2, wherein the signal output circuit is configured so that, in the read operation for the read target address,
it outputs the history signal associated with the first value if the drain current of the second transistor is larger than the drain current of the first transistor, while it outputs the history signal associated with the second value if the drain current of the first transistor is larger than the drain current of the second transistor, in the history memory cell, and
it outputs the data signal associated with the third value if the drain current of the third transistor is larger than the drain current of the fourth transistor, while it outputs the data signal associated with the fourth value if the drain current of the fourth transistor is larger than the drain current of the third transistor, in each of the data memory cells of the read target address.

4. The non-volatile memory according to claim 3, wherein
the control circuit is capable of performing a program operation on a write target address using the driving circuit after setting one of the plurality of addresses as the write target address,
in the program operation on the write target address, it injects hot carriers into the second transistor in the history memory cell of the write target address so as to increase a gate threshold voltage of the second transistor, and in each of the data memory cells of the write target address, it injects hot carriers to one of the third and fourth transistors as a target, so as to increase the gate threshold voltage of the transistor as the target,
if the read operation is performed in a state where a specific address is set as the read target address before the program operation is performed on the specific address, the drain current of the second transistor is larger than the drain current of the first transistor in the history memory cell of the read target address,
if the read operation is performed in a state where the specific address is set as the read target address after the specific address is set as the write target address and the program operation is performed on the specific address, the drain current of the first transistor is larger than the drain current of the second transistor due to an increase in the gate threshold voltage of the second transistor in the history memory cell of the read target address, and in each of the data memory cells of the read target address, the gate threshold voltage of one transistor out of the third and fourth transistors that is a target of the injection of hot carriers increases, which causes the drain current of the other transistor to be larger than the drain current of the one transistor.

5. The non-volatile memory according to claim 2, wherein the third and fourth transistors have the same structure in each of the data memory cells of each address.

6. A non-volatile memory comprising:
a memory cell having a first transistor and a second transistor;
a driving circuit configured to be capable of applying a read voltage to gates of the first transistor and the second transistor; and a signal output circuit configured to be capable of outputting a signal associated with a first value or a signal associated with a second value, based on drain currents of the first and second transistors, in a read operation in which the read voltage is applied, wherein the second transistor is constituted of a parallel circuit of a plurality of unit transistors, and gate width of each of the unit transistors is larger than that of the first transistor, wherein the signal output circuit is configured to output the signal associated with the first value if the drain current of the second transistor is larger than the drain current of the first transistor, and to output the signal associated with the second value if the drain current of the first transistor is larger than the drain current of the second transistor, in the read operation, and wherein the memory is capable of performing a program operation to increase a gate threshold voltage of the second transistor by injecting hot carriers into the second transistor, the drain current of the second transistor is larger than the drain current of the first transistor in the read operation performed before the program operation, and the drain current of the first transistor is larger than the drain current of the second transistor in the read operation performed after the program operation, due to increase in the gate threshold voltage of the second transistor by the program operation.

7. A non-volatile memory configured to store a plurality of bits of data in each of a plurality of addresses, comprising:

a history memory cell provided for each of the addresses so as to have a first transistor and a second transistor;

a plurality of data memory cells provided for each of the addresses, so as to have a third transistor and a fourth transistor;

a control circuit configured to be capable of setting one of the addresses as a read target address;

a driving circuit configured to be capable of applying a read voltage to gates of the first to fourth transistors in the history memory cell and the data memory cells assigned to the read target address; and a signal output circuit configured to be capable of outputting a history signal associated with a first value or a second value, based on drain currents of the first and second transistors in the history memory cell of the read target address, and to be capable of outputting a data signal associated with a third value or a fourth value, based on drain currents of the third and fourth transistors of the data memory cell, in each of the data memory cells of the read target address, in a read operation in which the read voltage is applied for the read target address, wherein in the history memory cell of each address, the second transistor is constituted of a parallel circuit of a plurality of unit transistors, and gate width of each of the unit transistors is larger than that of the first transistor.

* * * * *